(12) United States Patent
Yoshimura

(10) Patent No.: US 8,085,449 B2
(45) Date of Patent: Dec. 27, 2011

(54) IMAGE SENSOR AND IMAGE FORMING APPARATUS

(75) Inventor: Miyoshi Yoshimura, Akishima (JP)

(73) Assignee: Toshiba Design & Manufacturing Service Corporation, Fuchu-shi (JP)

( * ) Notice: Subject to any disclaimer, the term of this patent is extended or adjusted under 35 U.S.C. 154(b) by 1029 days.

(21) Appl. No.: 11/947,970

(22) Filed: Nov. 30, 2007

(65) Prior Publication Data

US 2008/0135759 A1 Jun. 12, 2008

(30) Foreign Application Priority Data

Nov. 30, 2006 (JP) ................................. 2006-324663
Nov. 30, 2006 (JP) ................................. 2006-324664

(51) Int. Cl.
*H04N 1/04* (2006.01)
(52) U.S. Cl. ......... 358/475; 358/482; 358/483; 358/514
(58) Field of Classification Search ................. 358/475, 358/482, 483, 514
See application file for complete search history.

(56) References Cited

U.S. PATENT DOCUMENTS

| | | | |
|---|---|---|---|
| 7,224,500 B2 * | 5/2007 | Konagaya | 358/475 |
| 7,692,822 B2 * | 4/2010 | Tanaka | 358/474 |
| 2003/0142208 A1 * | 7/2003 | Nakamura | 348/96 |

FOREIGN PATENT DOCUMENTS

| | | |
|---|---|---|
| JP | 54-154319 | 12/1979 |
| JP | 55-8976 U | 1/1980 |
| JP | 59-99577 U | 7/1984 |
| JP | 5-6971 U | 1/1993 |
| JP | 6-225077 | 8/1994 |
| JP | 2001-346002 | * 12/2001 |
| JP | 2003-87502 | 3/2003 |
| JP | 2005-167677 | 6/2005 |
| JP | 2006-197012 | 7/2006 |

OTHER PUBLICATIONS

Office Action mailed Oct. 4, 2011, in Japanese Patent Application No. 2006-324664 filed Nov. 30, 2006 with English Translation.

* cited by examiner

*Primary Examiner* — Houshang Safaipour
(74) *Attorney, Agent, or Firm* — Oblon, Spivak, McClelland, Maier & Neustadt, L.L.P.

(57) ABSTRACT

An image sensor includes a housing which receives heat of a circuit board, and a light source which is supported in the housing and radiates light toward a document. The light source is an EL light-emitting element including a light emission section which emits light by organic electroluminescence. The EL light-emitting element extends in a line shape along a scanning direction. A thermal diffusion layer is interposed between the EL light-emitting element and the housing.

14 Claims, 18 Drawing Sheets

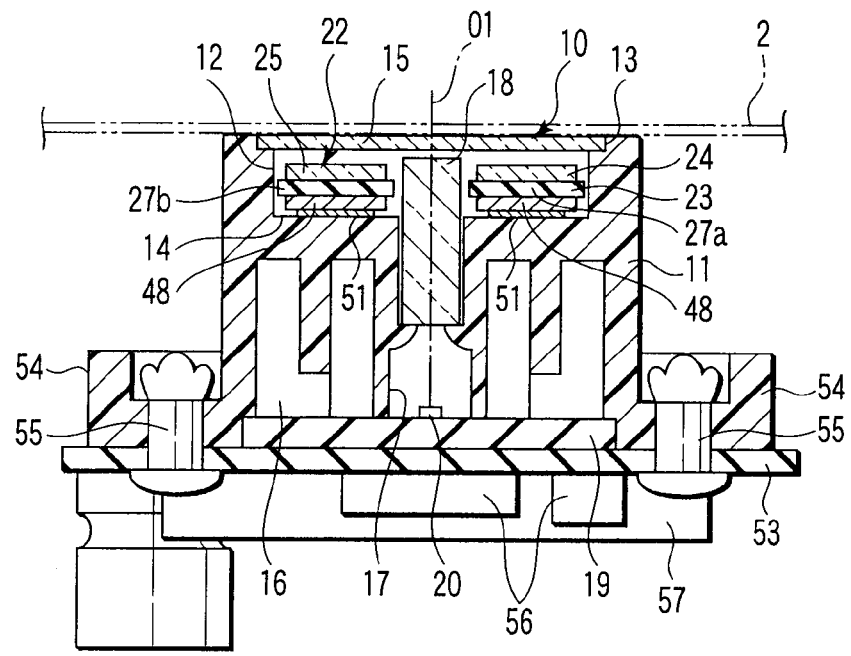
F I G. 3
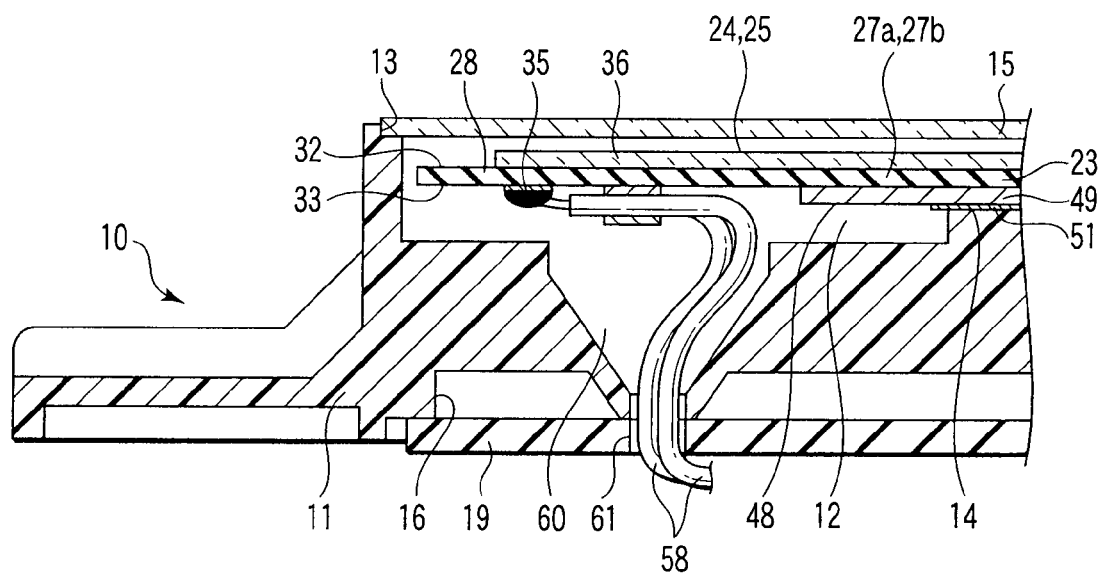
F I G. 4

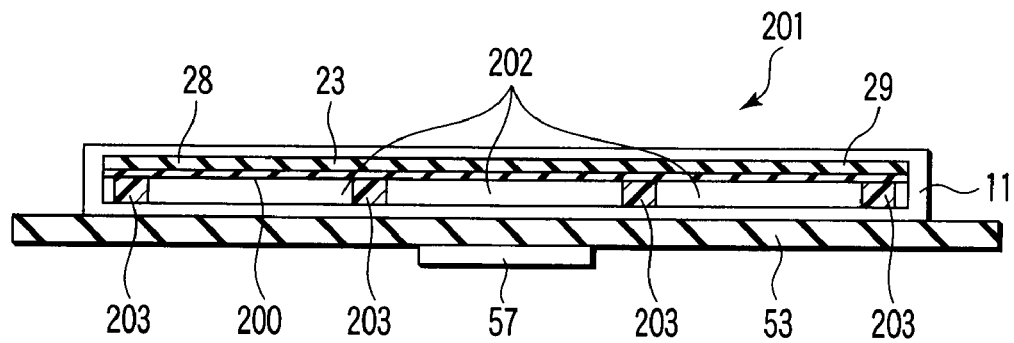
F I G. 19
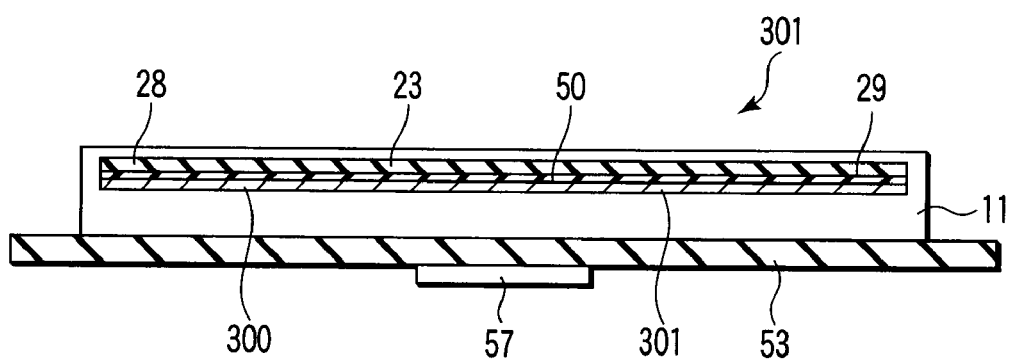
F I G. 20
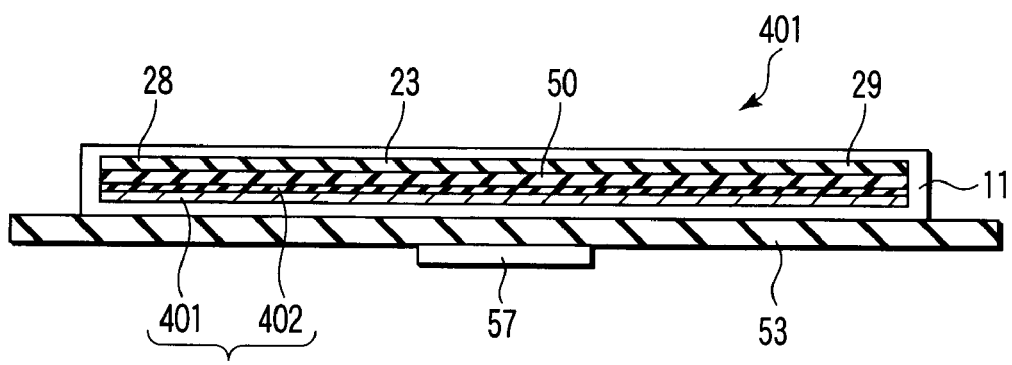
F I G. 21

IMAGE SENSOR AND IMAGE FORMING APPARATUS

CROSS-REFERENCE TO RELATED APPLICATIONS

This application is based upon and claims the benefit of priority from prior Japanese Patent Applications No. 2006-324663, filed Nov. 30, 2006; and No. 2006-324664, filed Nov. 30, 2006, the entire contents of both of which are incorporated herein by reference.

BACKGROUND OF THE INVENTION

1. Field of the Invention

The present invention relates to an image sensor including, as a light source, an EL light-emitting element which emits light by organic electroluminescence, and an image forming apparatus in which this image sensor is mounted. More particular, the invention relates to a structure for preventing a local temperature rise of an elongated EL light-emitting element.

2. Description of the Related Art

There are known multi-functional image forming apparatuses that are generally called "multi-function peripherals (MFP)" which have functions such as a scanner function, a printing function, a copy function and a network connection function.

This type of image forming apparatus includes a line-scan type image sensor which optically reads information, such as characters and images, from a to-be-scanned object such as a document. The image sensor includes a light source which radiates light on the to-be-scanned object. Conventionally, LED light-emitting elements have widely been used as such light sources.

On the other hand, in recent years, as disclosed in Jpn. Pat. Appln. KOKAI Publication No. 2003-87502, for example, there have been attempts to replace general LED light-emitting elements in image sensors with EL light-emitting elements. The EL light-emitting element includes a line-shaped glass base plate which extends in a scanning direction and a light emission section which is formed on the surface of the glass base plate. The light emission section emits light by electroluminescence when an electric field is applied, and the light emission section is electrically connected to electrodes which are formed at end portions of the glass base plate.

The EL light-emitting element, together with a circuit board which drives the EL light-emitting element, is supported in a case which is formed of a synthetic resin. The circuit board has a plurality of circuit components including an LSI which produces heat in operation. When the EL light-emitting element is caused to emit light, the EL light-emitting element itself produces heat, and heat of the LSI conducts from the circuit board to the EL light-emitting element via the housing. Then, the EL light-emitting element is not uniformly heated since it has an elongated shape extending in the scanning direction. In particular, a part of the EL light-emitting element, which is near the LSI, is locally heated up to high temperatures. As a result, the temperature distribution in the longitudinal direction of the EL light-emitting element becomes non-uniform, and a temperature difference occurs in the EL light-emitting element.

If a temperature difference occurs in the EL light-emitting element, the distribution of electric current varies and a great amount of current tends to flow in a high-temperature part. Thus, the luminance of the high-temperature part of the EL light-emitting element increases, and conversely the luminance of a low-temperature part decreases. Consequently, non-uniformity in luminance distribution occurs in the longitudinal direction of the EL light-emitting element.

Hence, in the image sensor which includes the EL light-emitting element as the light source, when light is radiated on the to-be-scanned object, the illuminance on the illuminated surface of the to-be-scanned object becomes non-uniform in the scanning direction. Image information on the to-be-scanned object is led to a light-receiving element, such as a CCD, as optical density information. Thus, if a difference in illuminance occurs on the illuminated surface of the to-be-scanned object, there arises such a problem that the output of the image sensor deteriorates and the image quality on a part with low illuminance becomes inferior to the image quality on a part with high illuminance.

Jpn. Pat. Appln. KOKAI Publication No. 2006-197012 discloses an image sensor wherein heat radiation properties of a CCD are enhanced and the quality of an image is improved. According to this document, the CCD, which produces heat, is thermally connected to the housing of the image scanning apparatus via a heat conductive body. The heat conductive body transfers the heat that is produced by the CCD to the housing. Thereby, the heat of the CCD is radiated from the surface of the housing to the atmospheric air.

The invention described in the above document, however, is an invention for mainly enhancing heat radiation properties of the CCD. This invention is not intended to prevent occurrence of a temperature difference in the CCD when the CCD is affected by thermal influence from outside.

In other words, in the invention of the above document, even though the heat of the CCD can be let to escape from the heat conductive body to the housing, there is a concern that the CCD may have a part with a high temperature and a part with a low temperature, depending on the positional relationship between the CCD and the heat conductive body. Consequently, even if the heat radiation technique disclosed in the above document is applied to an elongated line-shaped EL light-emitting element, a temperature difference will inevitably occur in the EL light-emitting element. Therefore, this technique cannot be an effective solution to eliminate the non-uniformity in luminance distribution of the EL light-emitting element.

On the other hand, Jpn. Pat. Appln. KOKAI Publication No. H6-225077 discloses a technique wherein the light intensity of a light source is detected by using a reception-light sensor which is provided in a line-scan-type image sensor, and an image signal is corrected on the basis of the detected light intensity.

In the image sensor disclosed in the above document, however, a complex signal processing circuit is required in order to correct the light intensity that is detected by the reception-light sensor. Hence, even if a good image signal is obtained by correcting the light intensity, an increase in cost of the signal processing circuit is inevitable. This leads to such a problem that the price of the image sensor rises.

BRIEF SUMMARY OF THE INVENTION

An object of the present invention is to provide an image sensor and an image forming apparatus, wherein when a line-shaped EL light-emitting element is affected by thermal influence, the heat that conducts in the EL light-emitting element can uniformly be diffused over the entire length, and non-uniformity in luminance distribution of the EL light-emitting element can be eliminated.

Another object of the present invention is to provide an image sensor and an image forming apparatus, wherein non-uniformity in luminance distribution of an EL light-emitting element can be eliminated, and when light is radiated from the EL light-emitting element on a to-be-scanned object, a difference in illuminance on the to-be-scanned object can be decreased and degradation in image quality can be prevented.

According to an aspect of the present invention, there is provided an image sensor comprises: a housing which receives heat of an exothermic body; and a light source which is supported in the housing and radiates light toward a to-be-scanned object. The light source is an EL light-emitting element including a light emission section which emits light by organic electroluminescence, the EL light-emitting element having a length extending in a line shape along a scanning direction, a thermal diffusion layer, which extends over an entirety of the length of the EL light-emitting element, being interposed between the EL light-emitting element and the housing.

According to another aspect of the present invention, there is provided an image sensor comprises: an EL light-emitting element including a light emission section which emits light by electroluminescence, the EL light-emitting element radiating light from the light emission section toward a to-be-scanned object and extending in a line shape along a scanning direction; a housing which supports the EL light-emitting element; a circuit board which is supported in the housing and produces heat in operation; and a thermal diffusion layer which is interposed between the EL light-emitting element and the housing over an entirety of a length of the EL light-emitting element.

According to another aspect of the present invention, there is provided an image sensor comprises: an EL light-emitting element including a light emission section which emits light by electroluminescence, the EL light-emitting element radiating light from the light emission section toward a to-be-scanned object and extending in a line shape along a scanning direction; a housing which supports the EL light-emitting element; and a circuit board which is supported in the housing and on which a circuit component, which produces heat, is mounted at a position corresponding to an intermediate part in a longitudinal direction of the EL light-emitting element. The light emission section of the EL light-emitting element has a light emission surface extending in the scanning direction, the light emission surface having a first end portion, a second end portion which is located on a side opposite to the first end portion, and an intermediate part which is located between the first end portion and the second end portion, a light-shield layer being formed on the light emission surface, the light-shield layer varying a light intensity distribution of the light emission surface such that a light intensity at the first and second end portions becomes higher than a light intensity at the intermediate part.

According to another aspect of the present invention, there is provided an image sensor comprises: an EL light-emitting element including a light emission section which emits light by electroluminescence, the EL light-emitting element radiating light from the light emission section toward a to-be-scanned object and extending in a line shape along a scanning direction; a housing which supports the EL light-emitting element; a circuit board which is supported in the housing and on which a circuit component, which produces heat, is mounted at a position corresponding to an intermediate part in a longitudinal direction of the EL light-emitting element; a transparent plate which is interposed between the EL light-emitting element and the to-be-scanned object; and a light-shield layer which is provided on the transparent plate and varies a light intensity distribution of the EL light-emitting element.

According to another aspect of the present invention, there is provided an image forming apparatus comprising a transfer path which transfers a to-be-scanned object; and an image sensor which is disposed on the transfer path and optically scans image information from the to-be-scanned object. The image sensor comprises: an EL light-emitting element including a light emission section which emits light by electroluminescence, the EL light-emitting element radiating light from the light emission section toward the to-be-scanned object and extending in a line shape along a scanning direction; a housing which supports the EL light-emitting element; a circuit board which is supported in the housing and produces heat in operation; and a thermal diffusion layer which is interposed between the EL light-emitting element and the housing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a cross-sectional view of the contact-type image sensor according to the first embodiment of the invention;

FIG. 4 is a cross-sectional view of a first end portion of the contact-type image sensor according to the first embodiment of the invention;

FIG. 19 is a cross-sectional view that schematically shows a contact-type image sensor according to a first comparative example;

FIG. 20 is a cross-sectional view that schematically shows a contact-type image sensor according to a second comparative example;

FIG. 21 is a cross-sectional view that schematically shows a contact-type image sensor according to a third comparative example;

DETAILED DESCRIPTION OF THE INVENTION

First Embodiment

A first embodiment of the present invention will now be described with reference to FIG. 1 to FIG. 12.

Figure 1:
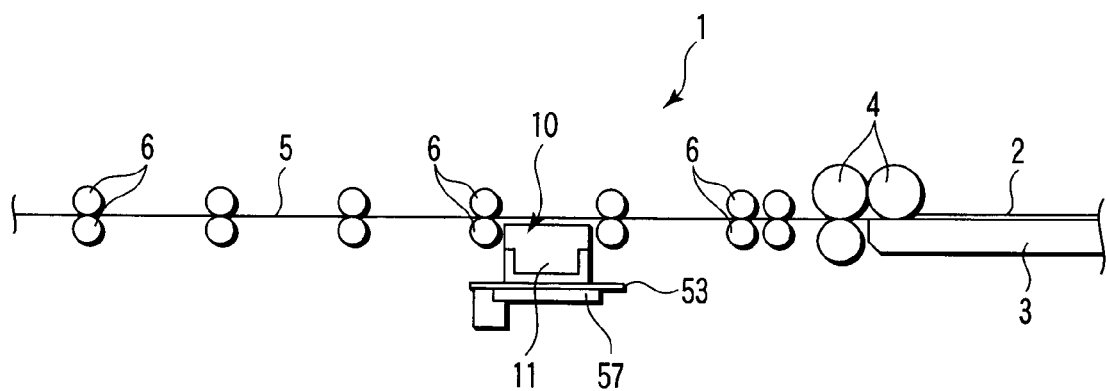
FIG. 1 is a side view that schematically shows an image forming apparatus according to a first embodiment of the present invention.

FIG. 1 schematically shows an image forming apparatus 1 in a linearly developed fashion. The image forming apparatus 1 includes a hopper table 3 on which a document 2, which is an example of a to-be-scanned object, is placed. The document 2, which is placed on the hopper table 3, is fed into a transfer path 5 via feed rollers 4. The transfer path 5 connects the hopper table 3 and a stacker (not shown).

A plurality of rollers 6 are disposed on the transfer path 5. The rollers 6 are disposed with intervals in the direction of feed of the document 2, and are configured to rotate in sync with each other. By the rotation of the rollers 6, documents 2 are successively fed from the beginning end of the transfer path 5 toward the terminal end of the transfer path 5. A contact-type image sensor 10 is disposed at an intermediate part of the transfer path 5. The contact-type image sensor 10 optically scans information, such as characters and images, from the document that is transferred along the transfer path 5, and the contact-type image sensor 10 is disposed under the transfer path 5.

Figure 2:
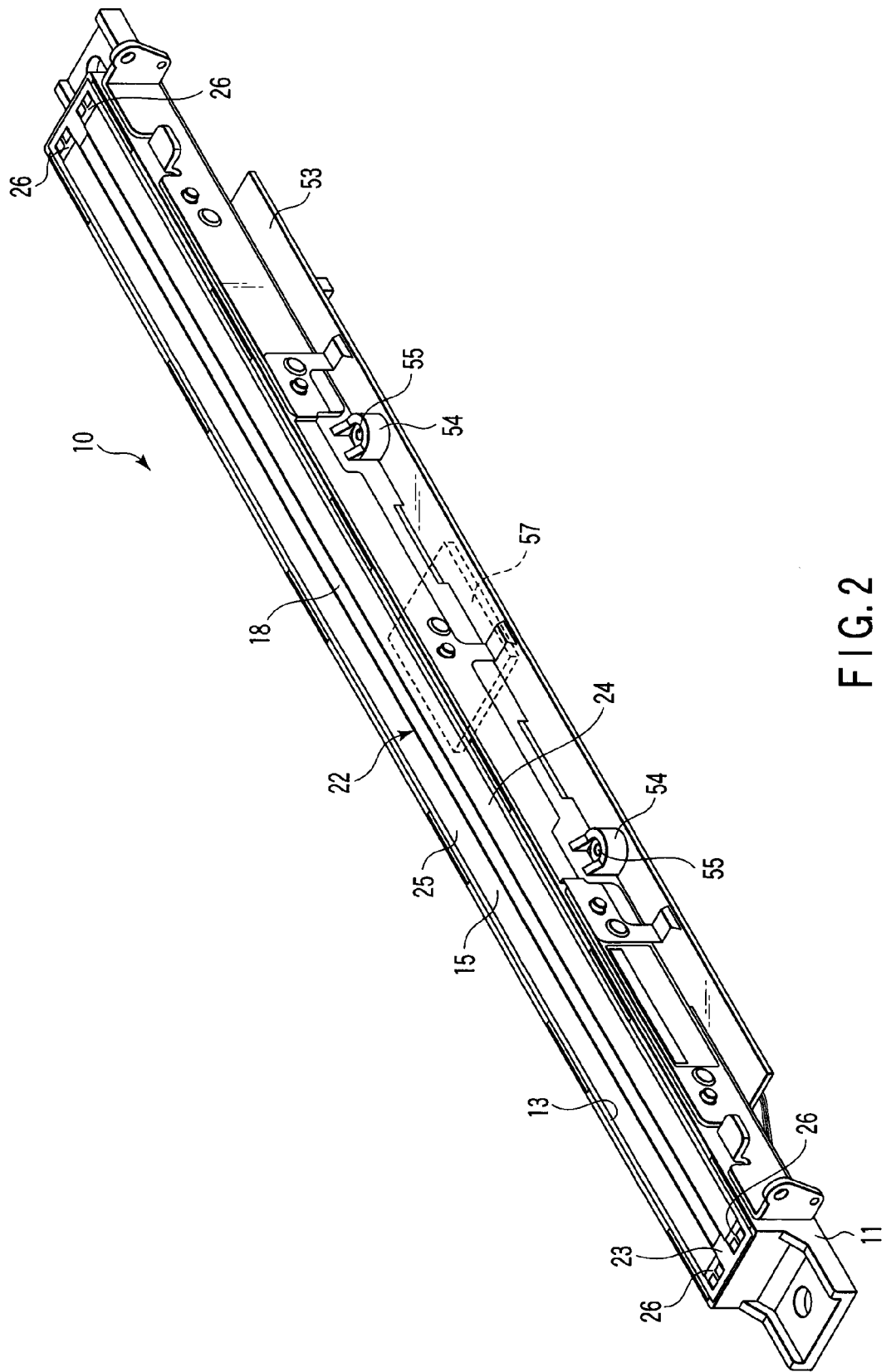
FIG. 2 is a perspective view of a contact-type image sensor according to the first embodiment of the invention.

Next, the contact-type image sensor 10 is described with reference to FIG. 2 to FIG. 4. The contact-type image sensor 10 includes a housing 11 that is formed of a synthetic resin. The housing 11 has an elongated rod-like shape along the scanning direction, and extends in a direction perpendicular to the direction of transfer of the document 2. As shown in FIG. 3, a first recess portion 12 is formed in an upper surface of the housing 11. The first recess portion 12 extends in a longitudinal direction of the housing 11. The first recess portion 12 has an opening portion 13 which opens to the upper surface of the housing 11, and a bottom surface 14 which is opposed to the opening portion 13. The opening portion 13 is closed by a transparent glass plate 15. The glass plate 15 is exposed to the transfer path 5, and the document 2 passes over the glass plate 15.

A second recess portion 16 is formed in the bottom surface of the housing 11. The second recess portion 16, like the first recess portion 12, extends in the longitudinal direction of the housing 11. The second recess portion 16 communicates with the first recess portion 12 via a communication hole 17 which is formed in the housing 11. The communication hole 17 is located at a central part in the width direction of the housing 11, and extends in the longitudinal direction of the housing 11.

A lens unit 18 is held in the communication hole 17. The lens unit 18, like the first recess portion 12, extends in the longitudinal direction of the housing 11. An upper end portion of the lens unit 18 projects inside the first recess portion 12. The lens unit 18 has a center axis 01 which extends upright in a direction perpendicular to the scanning direction.

A sensor board 19 is attached to the second recess portion 16. The sensor board 19 extends in the longitudinal direction of the housing 11 so as to close the second recess portion 16. A plurality of light-receiving elements 20, such as CCD sensors, are mounted on the upper surface of the sensor board 19. All light-receiving elements 20 are arranged in line at intervals in the longitudinal direction of the housing 11, and are disposed on the center axis 01 of the lens unit 18.

Figure 6:
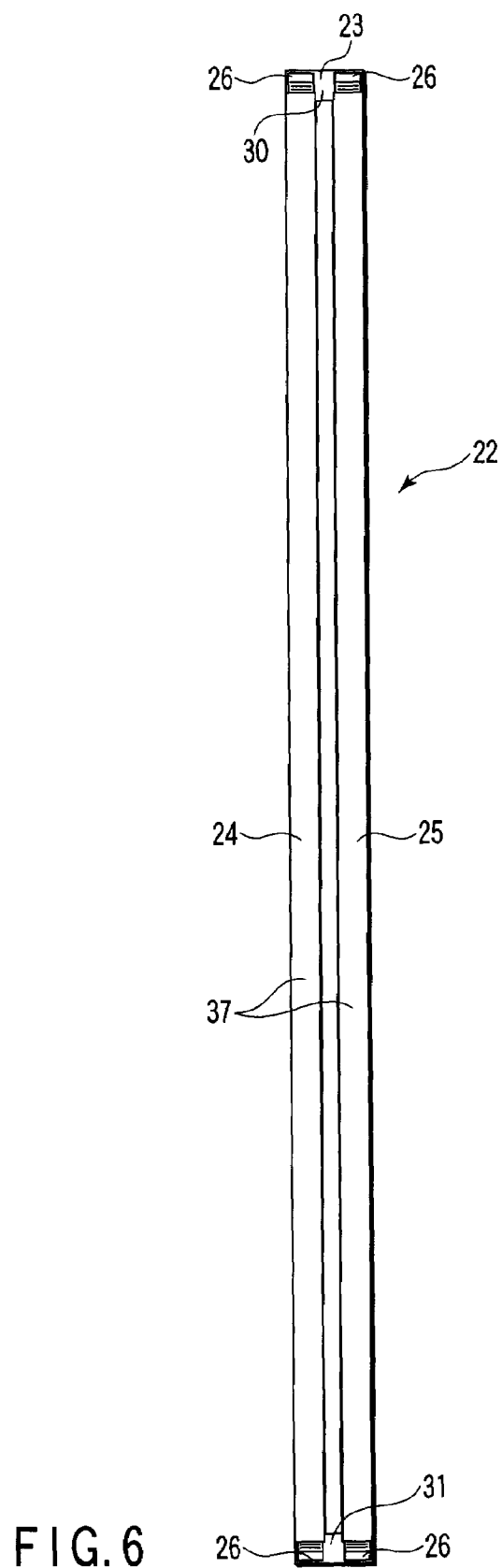
FIG. 6 is a plan view of an organic EL light source unit according to the first embodiment of the invention.

As shown in FIG. 3, the first recess portion 12 of the housing 11 accommodates an organic EL light source unit 22. FIG. 6 shows, in plan, the organic EL light source unit 22. The organic EL light source unit 22 of the present embodiment includes a rigid printed wiring board 23, a pair of EL light-emitting elements 24 and 25 which are attached to the printed wiring board 23, and a pair of flexible wiring boards 26 which are provided on each of the EL light-emitting elements 24 and 25.

The printed wiring board 23 includes a pair of EL support portions 27a and 27b. Each of the EL support portions 27a and 27b extends in a line shape in the longitudinal direction of the housing 11.

Figure 5:
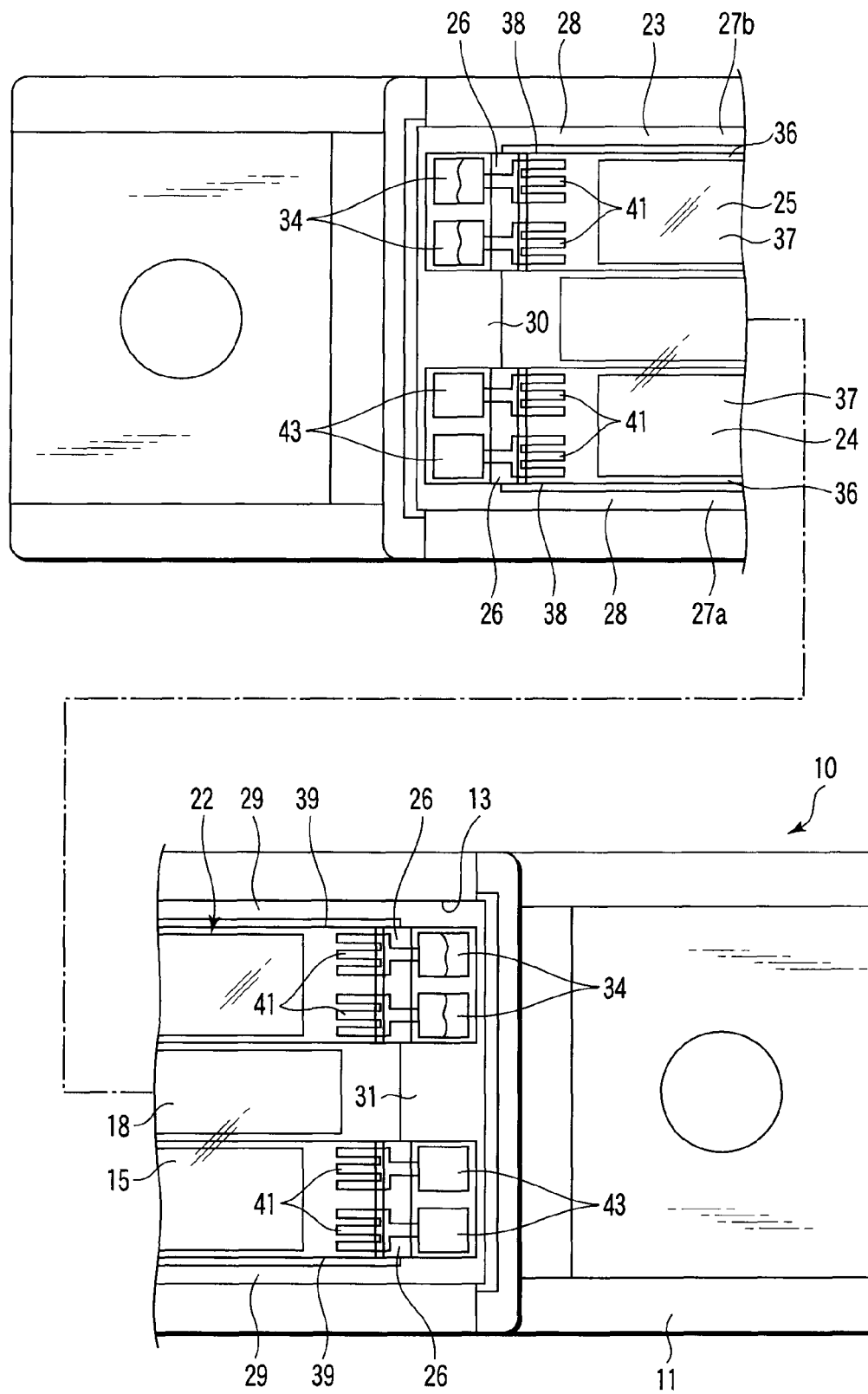
FIG. 5 is a plan view of the contact-type image sensor in the first embodiment of the invention, showing, in enlarged scale, a connection part between a printed wiring board and EL light-emitting elements.

As shown in FIG. 5, each of the EL support portions 27a and 27b has a first end portion 28 and a second end portion 29. The first end portion 28 is located at one end in the longitudinal direction of the EL support portion 27a or 27b. The second end portion 29 is located at the other end in the longitudinal direction of the EL support portion 27a or 27b. The first end portion 28 of one EL support portion 27a and the first end portion 28 of the other EL support portion 27b are connected to each other via a bridge portion 30. Similarly, the second end portion 29 of one EL support portion 27a and the second end portion 29 of the other EL support portion 27b are connected to each other via a bridge portion 31. Thus, the EL support portions 27a and 27b of the printed wiring board 23 are disposed in parallel with an interval therebetween.

Figure 8:
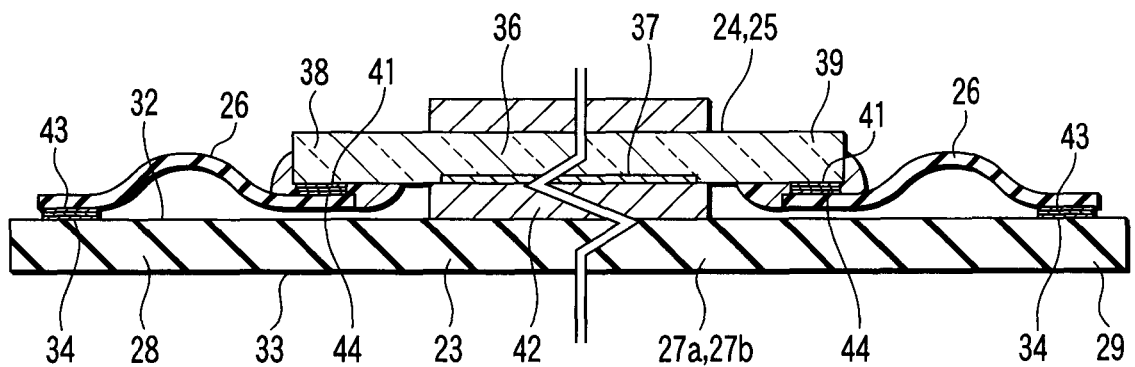
FIG. 8 is a cross-sectional view of the organic EL light source unit according to the first embodiment of the invention.

As shown in FIG. 4 and FIG. 8, each of the EL support portions 27a and 27b has a first surface 32 and a second surface 33 which is located opposite to the first surface 32. The first surface 32 faces toward the glass plate 15. A pair of first electrodes 34 and another pair of first electrodes 34 are provided at positions on the first surface 32, which correspond to the first end portion 28 and the second end portion 29. The first electrodes 34 are juxtaposed in the width direction of the EL support portion 27a or 27b, and are spaced part in the longitudinal direction of the EL support portion 27a or 27b. Accordingly, each of the EL support portions 27a and 27b has four first electrodes 34.

As shown in FIG. 4 and FIG. 8, the second surface 33 of the EL support portion 27a or 27b faces toward the bottom surface 14 of the first recess portion 12 of the housing 11. A pair of second electrodes 35 (only one second electrode 35 is shown in FIG. 4) are formed at a position on the second surface 33, which corresponds to the first end portion 28. The second electrodes 35 are electrically connected to the first electrodes 34 via a conductor layer (not shown) which is formed on the printed wiring board 23.

As shown in FIG. 3 to FIG. 8, the EL light-emitting elements 24 and 25 are mounted on the first surfaces 32 of the EL support portions 27a and 27b. Each of the EL light-emitting elements 24 and 25 includes a transparent glass base plate 36 and a light emission section 37. The glass base plate 36 extends in a line shape in the scanning direction. The glass base plate 36 has a first end portion 38 and a second end portion 39. The first end portion 38 is located at one end in the longitudinal direction of the glass base plate 36. The second end portion 39 is located at the other end in the longitudinal direction of the glass base plate 36.

A pair of third electrodes 41 are formed at each of the first and second end portions 38 and 39 of the glass base plate 36. The third electrodes 41 are, for example, ITO (Indium Tin Oxide) electrodes that are formed of oxide films of indium and tin, and are arranged in the width direction of the glass base plate 36.

As is shown in FIG. 8, the light emission section 37 is formed on the lower surface of the glass base plate 36, and extends in the longitudinal direction of the glass base plate 36. The light emission section 37 emits light by electroluminescence when an electric field is applied. One end and the other end in the longitudinal direction of the light emission section 37 are electrically connected to the third electrodes 41. Thus, an electric field is applied to the light emission section 37 by the application of a voltage between the said one end and other end of the light emission section 37.

Figure 7:
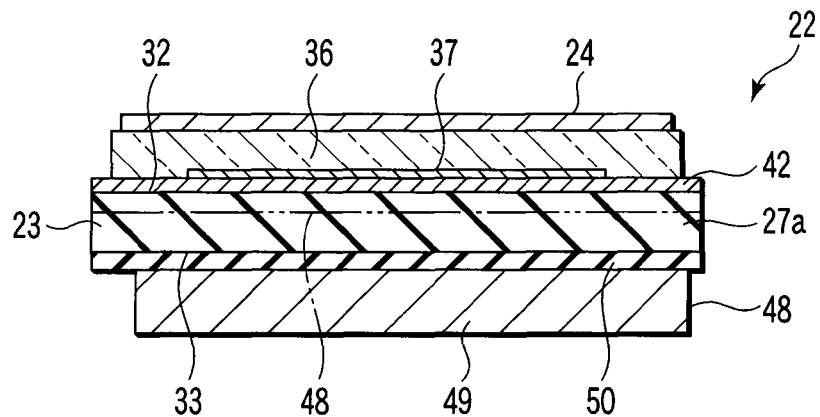
FIG. 7 is a cross-sectional view of the organic EL light source unit according to the first embodiment of the invention.

As shown in FIG. 7, the glass base plates 36 of the EL light-emitting elements 24 and 25 are adhered to the first surfaces 32 of the EL support portions 27a and 27b of the printed wiring board 23, for example, via double-coated adhesive tapes 42. By this adhesion, the EL light-emitting elements 24 and 25 are formed integral with the printed wiring board 23.

As is shown in FIG. 8, the flexible wiring boards 26 are provided on the first and second end portions 38 and 39 of the glass base plate 36. Each flexible wiring board 26 has fourth electrodes 43 and fifth electrodes 44.

The fourth electrodes 43 correspond to the first electrodes 34 of the printed wiring board 23, and are located at one end of the flexible wiring board 26. The fourth electrodes 43 are thermally press-bonded to the first electrodes 34 of the printed wiring board 23. The fifth electrodes 44 correspond to the third electrodes 41 of the glass base plate 36, and are located at the other end of the flexible wiring board 26. The fifth electrodes 44 are thermally press-bonded to the third electrodes 41 of the glass base plate 36. Thus, the flexible wiring boards 26 electrically connect the printed wiring board 23 and the EL light-emitting elements 24 and 25.

As is shown in FIG. 3, FIG. 4 and FIG. 7, a pair of thermal diffusion layers 48 are interposed between the EL light-emitting elements 24 and 25 and the bottom surface 14 of the first recess portion 12. A copper plate 49 with a thickness of 0.6 mm, for instance, is used as the thermal diffusion layer 48. The copper plate 49 is an example of a metal plate, and has a higher heat conductivity than the housing 11. For example, nickel plating is applied to the surface of the copper plate 49. The copper plate 49 has a strip shape extending between the first end portion 28 and second end portion 29 of the EL support portion 27a or 27b. Thus, the copper plate 49 has such a length as to extend over the entire length of the light emission section 37 of the EL light-emitting element 24 or 25 and has a uniform width over its own entire length.

As shown in FIG. 7, the copper plate 49 is stacked on the second surface 33 of the EL support portion 27a or 27b. An insulation tape 50 is interposed between the second surface 33 of the EL support portion 27a or 27b and the copper plate 49. The second electrodes 35, which are located on the second surface 33, are not covered with the copper plate 49 and insulation tape 50, and are exposed to the inside of the first recess portion 12.

As shown in FIG. 3 and FIG. 4, the copper plate 49 is fixed to the bottom surface 14 of the first recess portion 12 via a double-coated adhesive tape 51. By this fixation, the copper plate 49 is interposed between the housing 11 and the EL light-emitting element 24 or 25 and is thermally coupled thereto. In the state in which the EL light-emitting elements 24 and 25 are fixed in the first recess portion 12, the light emission sections 37 of the EL light-emitting elements 24 and 25 are arranged in two rows with the lens unit 18 being interposed.

Figure 9:
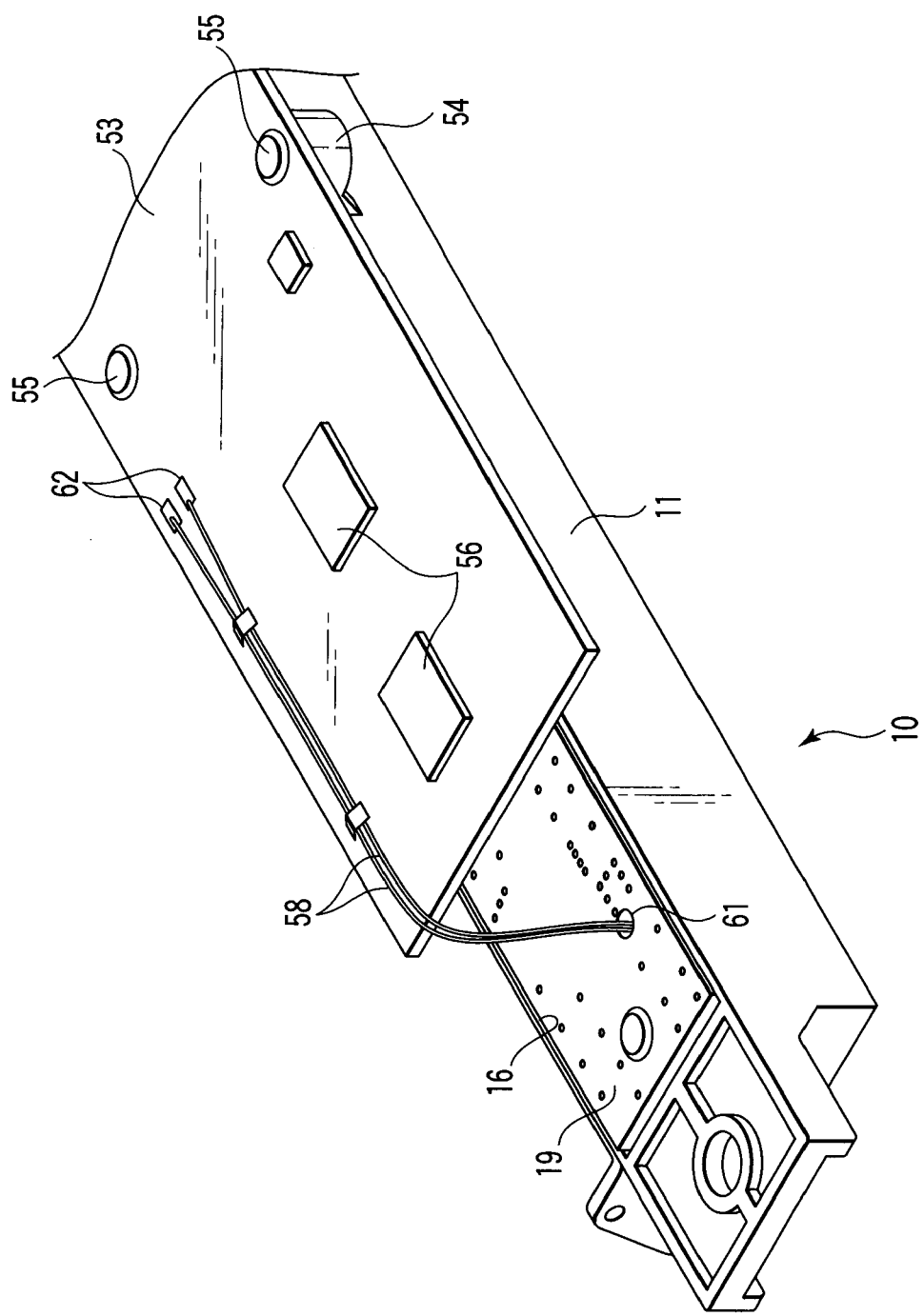
FIG. 9 is a perspective view of the contact-type image sensor in the first embodiment of the invention, showing a connection part between a circuit board, which is supported on a housing, and cables.

As shown in FIG. 3 and FIG. 9, a circuit board 53, which controls the driving of the EL light-emitting elements 24 and 25, is supported on the housing 11. The circuit board 53 has a rectangular shape extending in the longitudinal direction of the housing 11. The circuit board 53 is fixed, at a plurality of locations along the longitudinal direction thereof, to boss portions 54, which project from the side surfaces of the housing 11, by means of rivets 55. Further, the circuit board 53 is stacked on the lower surface of the sensor board 19 and is electrically connected to the sensor board 19.

A plurality of electronic circuit components 56 are mounted on the lower surface of the circuit board 53. The electronic circuit components 56 constitute, for instance, a driving circuit for driving the CCD sensors. The electronic circuit components 56 include an LSI 57 which produces heat in operation. The LSI 57 is an example of exothermic bodies, and is located at intermediate parts in the longitudinal direction of the EL light-emitting elements 24 and 25. The circuit board 53 is affected by thermal influence from the LSI 57 and produces heat. The heat that is produced from the LSI 57 is conducted from the circuit board 53 to the housing 11 via the sensor board 19 and rivets 55, and further the heat is conducted from the housing 11 to the EL light-emitting elements 24 and 25 via the copper plates 49 of the thermal diffusion layers 48.

As shown in FIG. 9, the circuit board 53 is electrically connected to the printed wiring board 23 of the organic EL light source unit 22 via two cables 58. The cables 58 are wired through a cable passage 60 which is formed in the housing 11 and a through-hole 61 which is formed in the sensor board 19.

As shown in FIG. 4, one end of each cable 58 is led from the cable passage 60 into between the printed wiring board 23 and the bottom surface 14 of the first recess portion 12, and the cables 58 are soldered to the second electrodes 35 of the printed wiring board 23. The cables 58 are led out of the housing 11 via the through-hole 61 from the cable passage 60. The other ends of the cables 58 are wired along the lower surface of the circuit board 53 and are soldered to a pair of pads 62 which are formed on the lower surface of the circuit board 53.

In the first embodiment, the organic EL light source unit 22 and the circuit board 53 are electrically connected via the cables 58. According to this connection method, for example, compared to the case in which the organic EL light source unit 22 and the circuit board 53 are directly connected by a plurality of metallic pin terminals which penetrate the housing 11, the heat of the circuit board 53 is less easily conducted from the circuit board 53 to the organic EL light source unit 22. Therefore, the thermal influence of the circuit board 53 on the EL light-emitting elements 24 and 25 can be suppressed as much as possible.

When the organic EL light source unit 22 having the above-described structure is operated, the light emission sections 37 of the EL light-emitting elements 24 and 25 emit light. The light from the light emission section 37 is radiated on the document 2 through the glass plate 15. The light that is radiated on the document 2 is reflected by the lower surface of the document 2 and guided to the light-receiving elements 20 via the lens unit 18. The light-receiving elements 20 output a signal of a level corresponding to the received light amount. Thereby, the information on the document 2, such as characters and images, are optically scanned.

During the operation of the organic EL light source unit 22, the electronic circuit components 56 including the LSI 57 produce heat. The heat produced by the electronic circuit components 56 and LSI 57 is conducted to the housing 11 via the circuit board 53, and the heat is then to be conducted to the EL light-emitting elements 24 and 25 from the housing 11. In particular, the LSI 57, the heat production amount of which is large, is located at intermediate parts in the longitudinal direction of the EL light-emitting elements 24 and 25. Thus, there is a concern that the intermediate part of the EL light-emitting element 24 or 25, which corresponds to the LSI 57, is more affected by thermal influence than the first and second end portions 38 and 39 thereof.

In the first embodiment, however, the thermal diffusion layer 48, which is formed by using the copper plate 49 having a higher heat conductivity than the housing 11, is interposed between the printed wiring board 23, which supports the EL light-emitting elements 24 and 25, and the housing 11. The copper plate 49 extends over the entire length of the light emission section 37 in the state in which the copper plate 49 is thermally connected to the housing 11 and the printed wiring board 23.

Thus, the heat, which is conducted to the housing 11 from the electronic circuit components 56 and LSI 57, is widely diffused by heat conduction to the copper plate 49 over the entire length of the copper plate 49. The heat that is diffused in the copper plate 49 is conducted from the copper plate 49 to the EL light-emitting element 24 or 25 via the printed wiring board 23.

As has been described above, the heat from the electronic circuit components 56 and LSI 57 is conducted to the EL light-emitting elements 24 and 25 in the state in which the heat is diffused by the copper plates 49 of the thermal diffusion layers 48. Thereby, local temperature rise of the EL light-emitting elements 24 and 25 can be prevented. Therefore, the temperature distribution of the EL light-emitting elements 24 and 25 can be made uniform as much as possible, and non-uniformity in luminance in the longitudinal direction (scanning direction) of the EL light-emitting elements 24 and 25 can be eliminated.

Hence, when light is radiated on the document 2 from the EL light-emitting elements 24 and 25, a difference in illuminance on the illuminated surface of the document 2 can be decreased. Therefore, degradation in image quality can be prevented, and the reliability in optical scanning of information from the document 2 can be enhanced.

Figure 10:
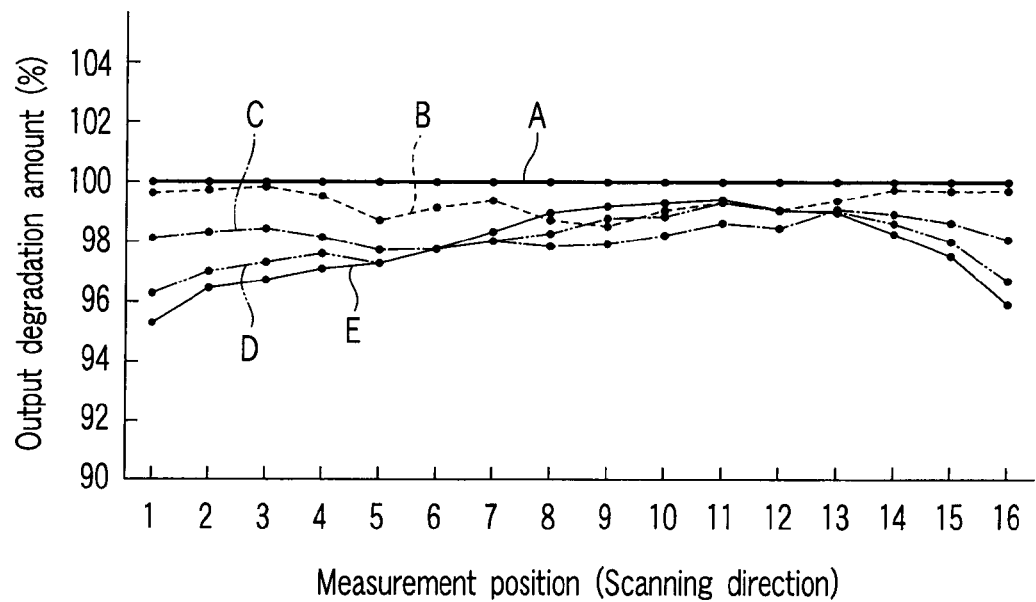
FIG. 10 is a characteristic graph showing a measurement result of an output degradation ratio of the contact-type image sensor, which uses a copper plate with a thickness of 0.6 mm, in the first embodiment of the invention, the measurement result being obtained for 30 minutes from the beginning of operation.

FIG. 10 shows a measurement result of an output degradation ratio of the contact-type image sensor 10, which employs the copper plate 49 with a thickness of 0.6 mm, the measurement result being obtained for 30 minutes from the beginning of operation. In the measurement, 16 equidistant measurement positions for output measurement are set in the scanning direction of the contact-type image sensor 10, and the degradation amount of the output at each measurement position was measured. The output at the time of the beginning of the operation of the contact-type image sensor 10 is set as an initial output value, and the degradation amount of output is expressed as a ratio of an output, which is measured after the passing of a predetermined time from the beginning of the operation, to the initial output value that is a reference value.

In FIG. 10, a characteristic A indicates an initial output before the operation of the contact-type image sensor 10, and characteristics B, C, D and E indicate outputs after the passing of 1 minute, 5 minutes, 10 minutes and 30 minutes from the beginning of the operation, respectively.

As is clear from FIG. 10, the output of the contact-type image sensor 10 gradually deteriorates immediately after the beginning of operation. At a time point after the passing of 5 minutes, the degradation amounts from the measurement position 1 to measurement position 16 are substantially equal.

Further, even at a time point after the passing of 30 minutes, at measurement positions 8 and 9 which correspond to the intermediate part of the contact-type image sensor 10 in the vicinity of the LSI 57, no degradation in output is recognized, nor does the output exceed the initial output value. In addition, the degradation amount is suppressed to about 4% at one end and the other end in the longitudinal direction of the contact-type image sensor 10.

From the above result, it is understood that with the use of the copper plates 49 as the thermal diffusion layer 48s, the temperature distribution of the EL light-emitting elements 24 and 25 are made uniform, and the non-uniformity in luminance distribution of the EL light-emitting elements 24 and 25 can be suppressed.

Figure 11:
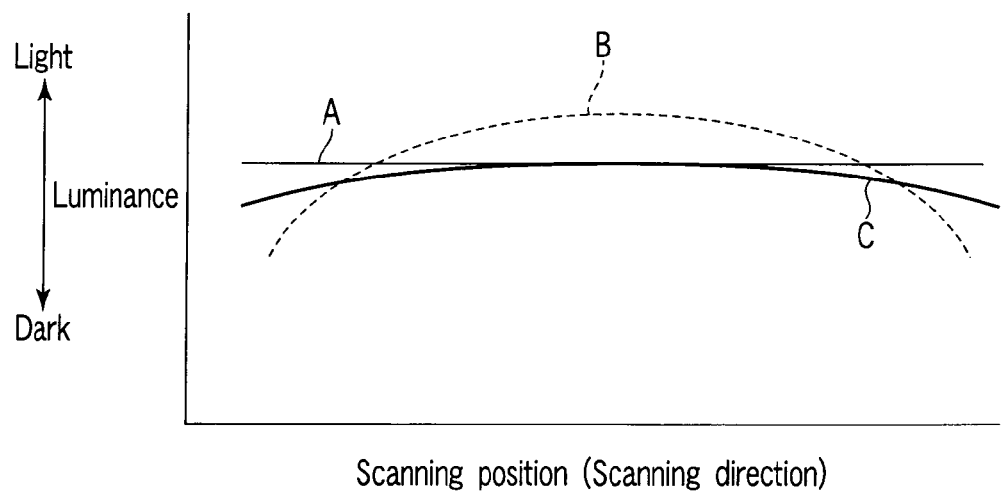
FIG. 11 is a characteristic graph showing, by an output of the contact-type image sensor, a luminance distribution of light emission sections of the EL light-emitting elements in the first embodiment of the invention, when the EL light-emitting elements are affected by thermal influence of circuit components.

FIG. 11 is a characteristic graph showing, by an output of the contact-type image sensor 10, the luminance distribution of the light emission sections 37 when the EL light-emitting elements 24 and 25 are affected by thermal influence. In FIG. 11, a characteristic A indicates an output at a time when the contact-type image sensor 10 starts operating. A characteristic B indicates an output of the contact-type image sensor in which the copper plate 49 is dispensed with. A characteristic C indicates an output of the contact-type image sensor 10 of the invention in which the copper plate 49 is used as the thermal diffusion layer 48.

When the contact-type image sensor 10 starts operating, the temperature rise of the electronic circuit components 56 and LSI 57 is small, and the temperature distribution in the scanning direction of the EL light-emitting elements 24 and 25 is uniform. Thus, in FIG. 11, the output at the time of the start of operation of the contact-type image sensor 10 is set as the initial value, and the output after 30 minutes from the start of operation of the contact-type image sensor 10 is indicated as a ratio to this initial value that is the reference value.

In the contact-type image sensor in which the copper plates 49 are not provided, as indicated by the characteristic B, the luminance at the intermediate parts of the EL light-emitting elements 24 and 25, which corresponds to the LSI 57, is higher than the luminance at the first and second end portions 38 and 39 thereof. The main factor of this is that the temperature of the intermediate parts of the EL light-emitting elements 24 and 25 is affected by thermal influence of the LSI 57 and becomes higher than the temperature of the first and second end portions 38 and 39 and non-uniformity occurs in the temperature distribution along the scanning direction of the EL light-emitting elements 24 and 25.

By contrast, in the contact-type image sensor 10 of the present invention, as indicated by the characteristic C, compared to the characteristic B, the luminance at the intermediate parts of the EL light-emitting elements 24 and 25, which corresponds to the LSI 57, lowers, and the luminance at the first and second end portions 38 and 39 increases conversely. It follows from this that by virtue of the presence of the copper plate 49s of the thermal diffusion layer 48s, the non-uniformity in temperature distribution in the scanning direction of the EL light-emitting elements 24 and 25 is suppressed, and the ratio of variation of luminance along the longitudinal direction of the EL light-emitting elements 24 and 25 can be decreased.

Figure 12:
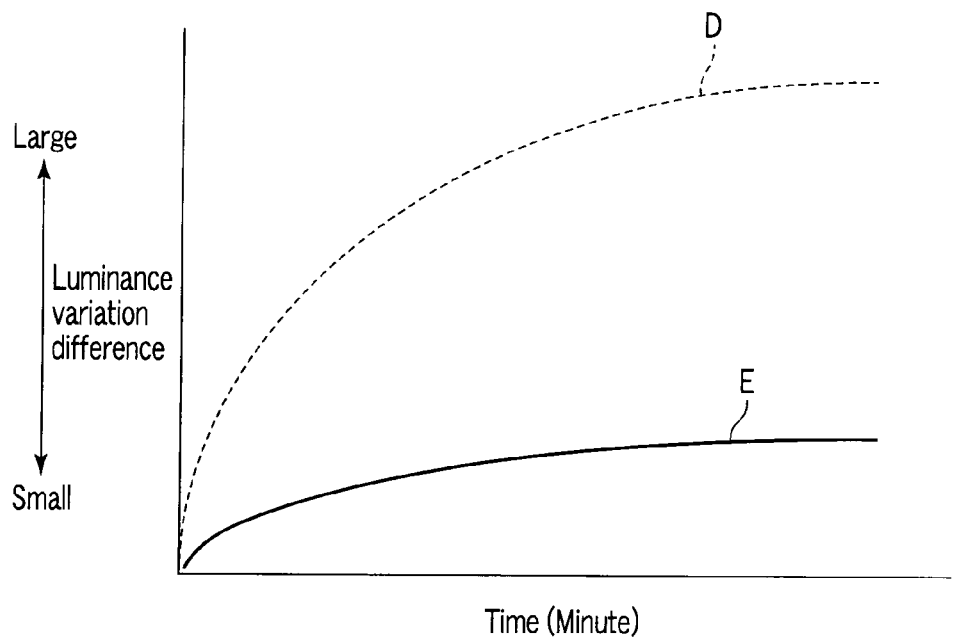
FIG. 12 is a characteristic graph showing a state in which the luminance varies with the passing of the operation time of the contact-type image sensor in the first embodiment of the invention.

FIG. 12 shows the state in which the luminance of the EL light-emitting elements 24 and 25 varies with the passing of the operation time of the contact-type image sensor 10. In FIG. 12, the variation in luminance of the EL light-emitting elements 24 and 25 is indicated by a difference between a maximum value and a minimum value of luminance. In FIG. 12, a characteristic D indicates a variation difference of the luminance of the contact-type image sensor in which the copper plate 49 is dispensed with. In FIG. 12, a characteristic E indicates a variation difference of the luminance of the contact-type image sensor 10 of the present invention in which the copper plates 49 are used. As is understood from FIG. 12, by using the copper plates 49 for the thermal diffusion layers 48, the variation difference of the luminance of the EL light-emitting elements 24 and 25 is decreased. The reason for this is that the heat of the electronic circuit components 56 and LSI 57 is diffused by the copper plates 49 over the wide range of the EL light-emitting elements 24 and 25, and the temperature distribution of the EL light-emitting elements 24 and 25 is made uniform.

In the present invention, the structure of the thermal diffusion layer 48 is not limited to that specified in the first embodiment, and this structure may variously be modified in practice. In the first embodiment, the thermal diffusion layer 48 is configured to be provided on that surface of the printed wiring board 23, which is opposite to the EL light-emitting element 24 or 25. However, the present invention is not limited to this structure. For example, as indicated by a two-dot-and-dash line in FIG. 7, the thermal diffusion layer 48 may be provided on that surface of the printed wiring board 23, which faces the EL light-emitting element 24 or 25.

Second Embodiment

Figure 13A:
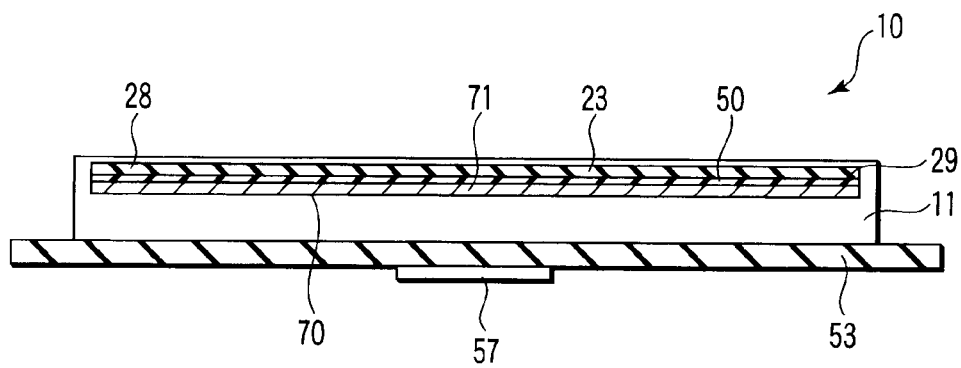
FIG. 13A is a cross-sectional view that schematically shows a contact-type image sensor according to a second embodiment of the present invention.
Figure 13B:
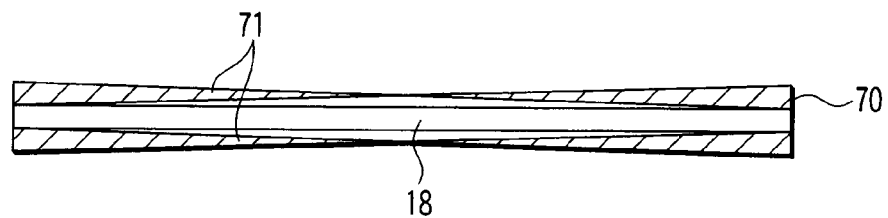
FIG. 13B is a cross-sectional view that shows a thermal diffusion layer in a planar fashion, which is used in the contact-type image sensor according to the second embodiment of the present invention.

FIG. 13A and FIG. 13B schematically show a contact-type image sensor 10 including a thermal diffusion layer 70 according to a second embodiment of the present invention. FIG. 13A is a cross-sectional view of the contact-type image sensor 10, and FIG. 13B is a cross-sectional view showing the thermal diffusion layer 70 of the contact-type image sensor 10 in a planar fashion.

The thermal diffusion layer 70 is formed of a copper plate 71 with a thickness of, e.g. 0.8 mm. The copper plate 71 extends over the entire length of the printed wiring board 23. In addition, as shown in FIG. 13B, each copper plate 71 has a width which gradually decreases from the first and second end portions 28 and 29 of the printed wiring board 23 toward the intermediate part thereof.

Accordingly, the area of contact between the printed wiring board 23 and copper plate 71 is small at the intermediate part of the copper plate 71, which corresponds to the LSI 57 that has a large heat production amount. Conversely, the area of contact between the printed wiring board 23 and copper plate 71 is large at one end portion and the other end portion in the longitudinal direction of the copper plate 71. Thus, the heat of the housing 11 is more easily conducted to the printed wiring board 23 and EL light-emitting elements at the first and second end portions 28 and 29 of the printed wiring board 23 than at the intermediate part of the printed wiring board 23.

Third Embodiment

Figure 14A:
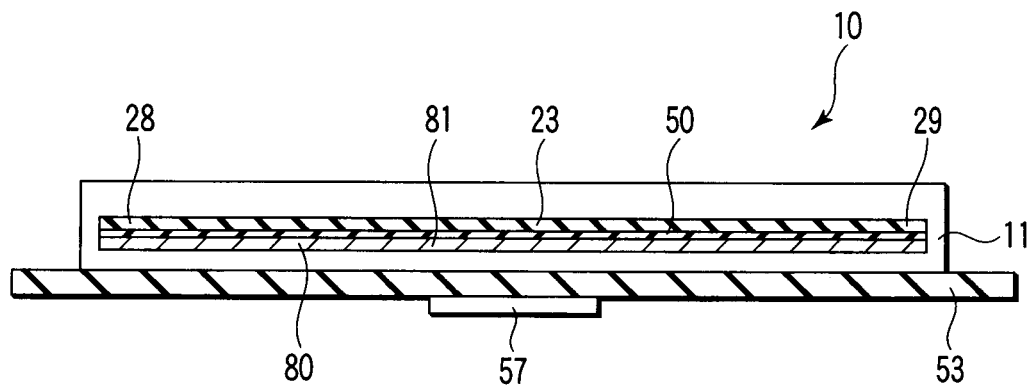
FIG. 14A is a cross-sectional view that schematically shows a contact-type image sensor according to a third embodiment of the present invention.
Figure 14B:
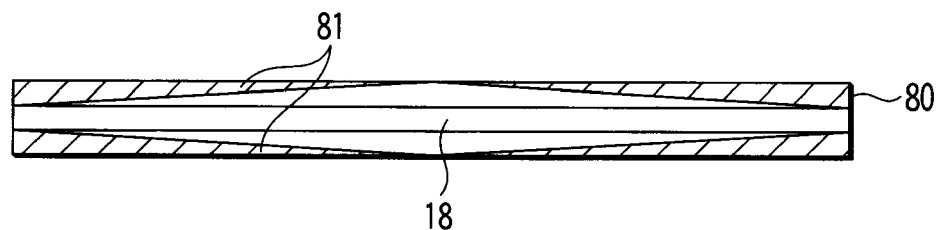
FIG. 14B is a cross-sectional view that shows a thermal diffusion layer in a planar fashion, which is used in the contact-type image sensor according to the third embodiment of the present invention.

FIG. 14A and FIG. 14B schematically show a contact-type image sensor 10 including a thermal diffusion layer 80 according to a third embodiment of the present invention. FIG. 14A is a cross-sectional view of the contact-type image sensor 10, and FIG. 14B is a cross-sectional view showing the thermal diffusion layer 80 of the contact-type image sensor 10 in a planar fashion.

The thermal diffusion layer 80 is formed of an aluminum plate 81 with a thickness of, e.g. 0.8 mm. The aluminum plate 81 is an example of a metal plate and extends over the entire length of the printed wiring board 23. In addition, as shown in FIG. 14B, each aluminum plate 81 has a width which gradually decreases from the first and second end portions 28 and 29 of the printed wiring board 23 toward the intermediate part thereof.

Accordingly, the area of contact between the printed wiring board 23 and aluminum plate 81 is small at the intermediate part of the aluminum plate 81, which corresponds to the LSI 57 that has a large heat production amount. Conversely, the area of contact between the printed wiring board 23 and aluminum plate 81 is large at one end portion and the other end portion in the longitudinal direction of the aluminum plate 81. Thus, the heat of the housing 11 is more easily conducted to the printed wiring board 23 and EL light-emitting elements at the first and second end portions 28 and 29 of the printed wiring board 23 than at the intermediate part of the printed wiring board 23.

Fourth Embodiment

Figure 15:
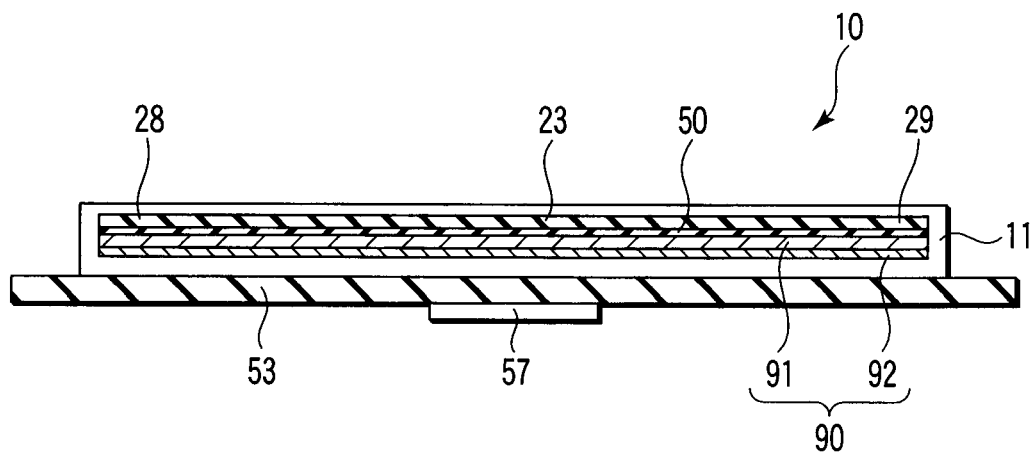
FIG. 15 is a cross-sectional view that schematically shows a contact-type image sensor according to a fourth embodiment of the present invention.

FIG. 15 schematically shows a contact-type image sensor 10 including a thermal diffusion layer 90 according to a fourth embodiment of the present invention. The thermal diffusion layer 90 is formed of an aluminum plate 91 with a thickness of, e.g. 0.8 mm, and an anisotropic heat conductive sheet 92 with a thickness of, e.g. 0.1 mm.

Each of the aluminum plate 91 and anisotropic heat conductive sheet 92 has a strip shape extending over the entire length of the printed wiring board 23, and has a uniform width over the entire length. The aluminum plate 91 and anisotropic heat conductive sheet 92 are stacked on each other. The anisotropic heat conductive sheet 92 is formed of carbon as a main ingredient, and has thermal diffusion properties. The anisotropic heat conductive sheet 92 is interposed between the aluminum plate 91 and the housing 11, and thermally connects the housing 11 and the aluminum plate 91.

Fifth Embodiment

Figure 16:
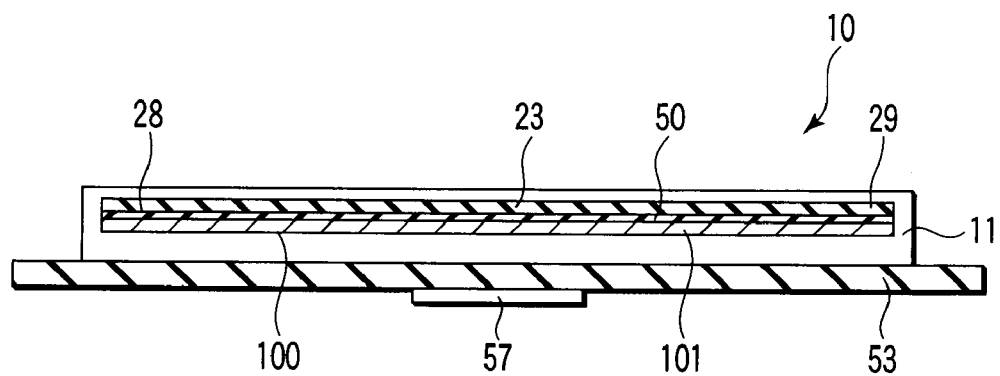
FIG. 16 is a cross-sectional view that schematically shows a contact-type image sensor according to a fifth embodiment of the present invention.

FIG. 16 schematically shows a contact-type image sensor 10 including a thermal diffusion layer 100 according to a fifth embodiment of the present invention. The thermal diffusion layer 100 is formed of an aluminum plate 101 with a thickness of, e.g. 0.8 mm. The aluminum plate 101 has a strip shape extending over the entire length of the printed wiring board 23, and has a uniform width over the entire length.

Sixth Embodiment

Figure 17:
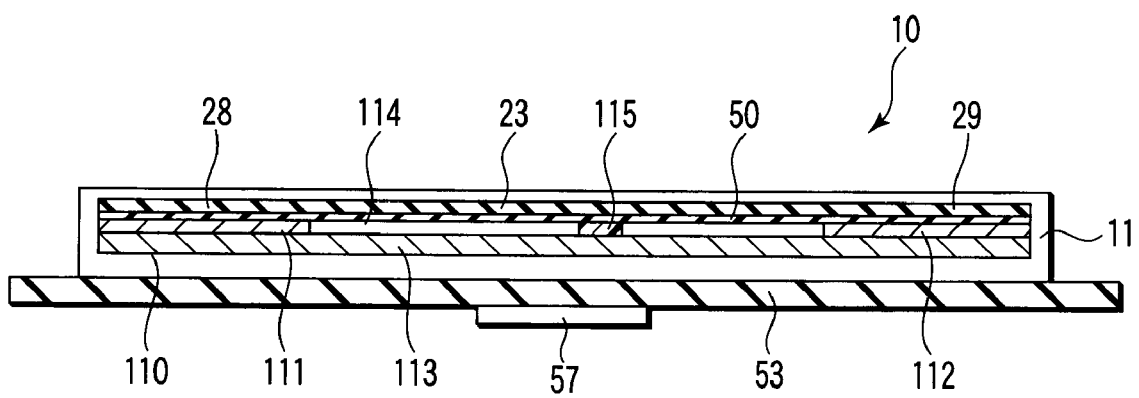
FIG. 17 is a cross-sectional view that schematically shows a contact-type image sensor according to a sixth embodiment of the present invention.

FIG. 17 schematically shows a contact-type image sensor 10 including a thermal diffusion layer 110 according to a sixth embodiment of the present invention. The thermal diffusion layer 110 is formed of first and second aluminum plates 111 and 112 each having a thickness of, e.g. 0.8 mm, and an anisotropic heat conductive sheet 113 with a thickness of, e.g. 0.1 mm.

The first aluminum plate 111 has a strip shape with a length corresponding to the first end portion 28 of the printed wiring board 23, and has a uniform width over the entire length thereof. Similarly, the second aluminum plate 112 has a strip shape with a length corresponding to the second end portion 29 of the printed wiring board 23, and has a uniform width over the entire length thereof. Thus, the first aluminum plate 111 and second aluminum plate 112 are spaced apart in the longitudinal direction of the printed wiring board 23.

The anisotropic heat conductive sheet 113 is formed of carbon as a main ingredient, and has thermal diffusion properties. The anisotropic heat conductive sheet 113 has a strip shape extending over the entire length of the printed wiring board 23, and has a uniform width over the entire length. The anisotropic heat conductive sheet 113 and first aluminum plate 111 are stacked on each other, and the anisotropic heat conductive sheet 113 and second aluminum plate 112 are stacked on each other. The anisotropic heat conductive sheet 113 is interposed between the first and second aluminum plates 111 and 112 and the housing 11, and thermally connects the housing 11 and the first and second aluminum plates 111 and 112.

An intermediate part in the longitudinal direction of the anisotropic heat conductive sheet 113 faces an insulation tape 50, which covers the lower surface of the printed wiring board 23, between the first aluminum plate 111 and second aluminum plate 112. An air layer 114 is formed between the intermediate part of the anisotropic heat conductive sheet 113 and the insulation tape 50. A spacer 115 is interposed between the intermediate part of the anisotropic heat conductive sheet 113 and the insulation tape 50, thereby keeping a distance therebetween.

Figure 18:
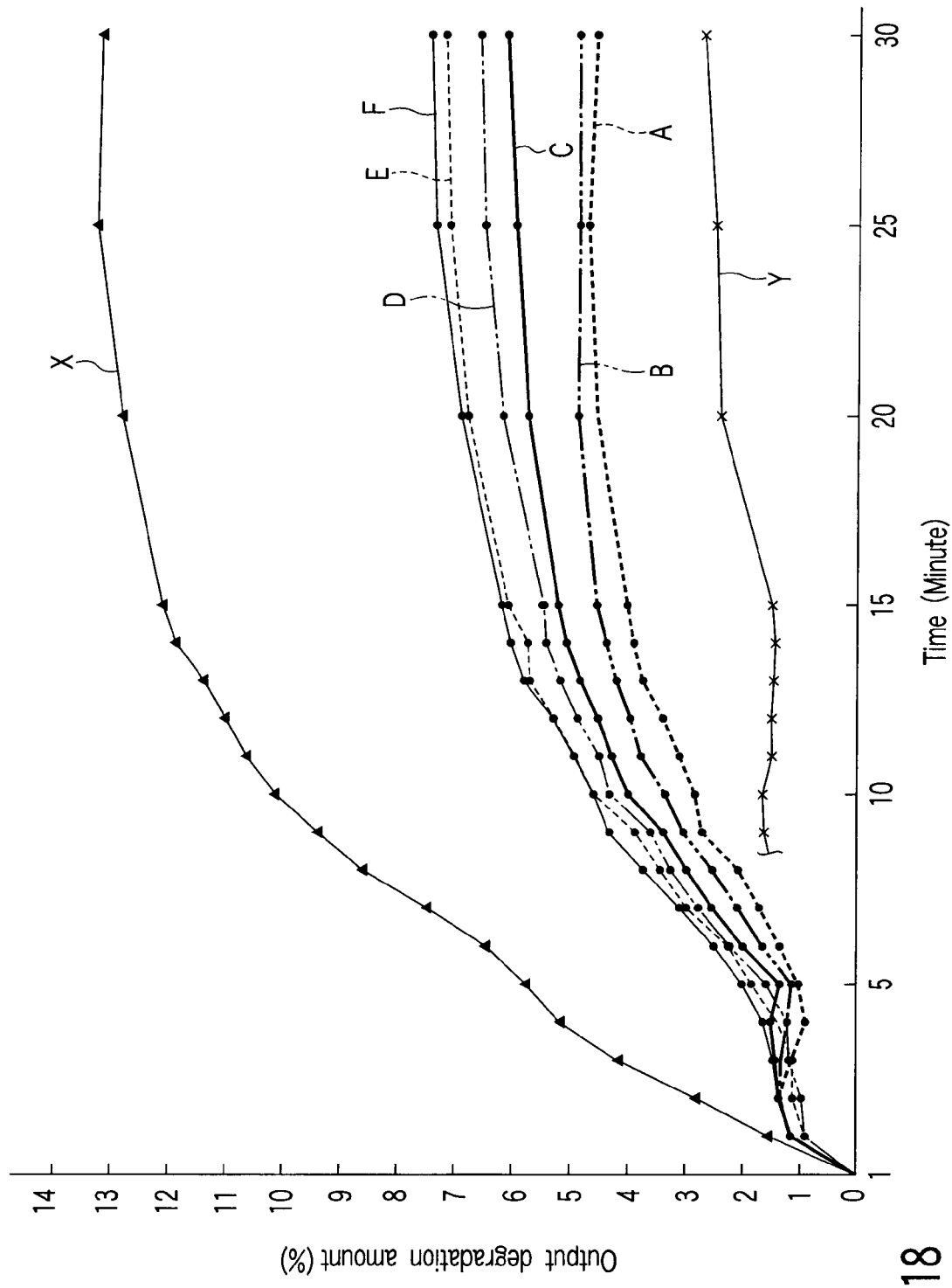
FIG. 18 is a characteristic graph showing a measurement result of degradation of outputs of the contact-type image sensors according to the first to sixth embodiments of the invention, the measurement result being obtained for 30 minutes from the beginning of operation.

In the meantime, the inventor of the present invention conducted experiments of measuring the degradation of outputs of the contact-type image sensors 10 according to the first to sixth embodiments, the measurement result being obtained for 30 minutes from the beginning of operation. FIG. 18 shows the result of experiments.

As regards the result of experiments, the difference between a maximum value and a minimum value of the output at the time of the beginning of the operation of the contact-type image sensor 10 is set as an initial output value, and the output after the passing of a predetermined time from the beginning of the operation is indicated as a ratio to the initial output value that is a reference value.

In FIG. 18, a characteristic A indicates an output of the contact-type image sensor 10 according to the first embodiment. A characteristic B indicates an output of the contact-type image sensor 10 according to the second embodiment. A characteristic C indicates an output of the contact-type image sensor 10 according to the third embodiment. A characteristic D indicates an output of the contact-type image sensor 10 according to the fourth embodiment. A characteristic E indicates an output of the contact-type image sensor 10 according to the fifth embodiment. A characteristic F indicates an output of the contact-type image sensor 10 according to the sixth embodiment.

Further, in FIG. 18, a characteristic X indicates an output of a contact-type image sensor having no thermal diffusion layer. A characteristic Y indicates an output of a conventional contact-type image sensor which employs an LED as a light source.

According to the result of experiments, it is understood that the degradation amount of outputs after the passing of 30 minutes from the beginning of operation is suppressed to about 7.5% at maximum in the contact-type image sensors 10 in which the thermal diffusion layer 48, 70, 80, 90, 100, 110 is interposed between the housing 11 and the printed wiring board 23.

By contrast, in the contact-type image sensor having no thermal diffusion layer, the degradation amount of the output after the passing of 30 minutes from the beginning of operation exceeds 13%. It follows from this that the thermal diffusion layer 48, 70, 80, 90, 100, 110 effectively contributes to suppression of the degradation amount of the output of the contact-type image sensor 10.

In particular, when the copper plates 49 and 71 are used as the thermal diffusion layers 48 and 70, the degradation amount of outputs after the passing of 30 minutes from the beginning of operation are suppressed to 4.5% and 4.9%, respectively. Thus, in order to decrease the degradation amount of the output of the contact-type image sensor 10, it is preferable to use copper which has a higher heat conductivity than aluminum.

The inventor conducted similar experiments by varying the thickness of the copper plate 49 of the first embodiment from 0.6 mm to 0.8 mm. As a result, it was made clear that the degradation amount of the output after the passing of 30 minutes from the beginning of operation is suppressed to 4.1%.

On the other hand, in order to confirm the superiority of the thermal diffusion layers 48, 70, 80, 90, 100 and 110 for which metal plates of copper or aluminum are used, the inventor conducted similar experiments by fabricating, as comparative examples, contact-type image sensors having thermal diffusion layers for which metal plates are not used.

FIG. 19 schematically shows, as a first comparative example, a contact-type image sensor 201 including a thermal diffusion layer 200. The thermal diffusion layer 200 is formed of an air layer 202 with a thickness of 0.8 mm. The air layer 202 is formed by interposing a plurality of spacers 203 of a synthetic resin between the printed wiring board 23 and the housing 11.

FIG. 20 schematically shows, as a second comparative example, a contact-type image sensor 301 including a thermal diffusion layer 300. The thermal diffusion layer 300 is formed of an anisotropic heat conductive sheet 301 with a thickness of 0.025 mm. The anisotropic heat conductive sheet 301 is formed of carbon as a main ingredient, and has heat conductivity. The anisotropic heat conductive sheet 301 has a strip shape extending over the entire length of the printed wiring board 23, and has a uniform width over the entire length thereof.

FIG. 21 schematically shows, as a third comparative example, a contact-type image sensor 401 including a thermal diffusion layer 400. The thermal diffusion layer 400 is formed of an anisotropic heat conductive sheet 401 with a thickness of 0.1 mm, and a rubber sheet 402 with a thickness of 0.5 mm. The anisotropic heat conductive sheet 401 and the rubber sheet 402 are stacked on each other. The anisotropic heat conductive sheet 401 is formed of carbon as a main ingredient, and has thermal diffusion properties. The anisotropic heat conductive sheet 401 is located on the housing 11 side. The rubber sheet 402 is located on the printed wiring board 23 side.

Figure 22:
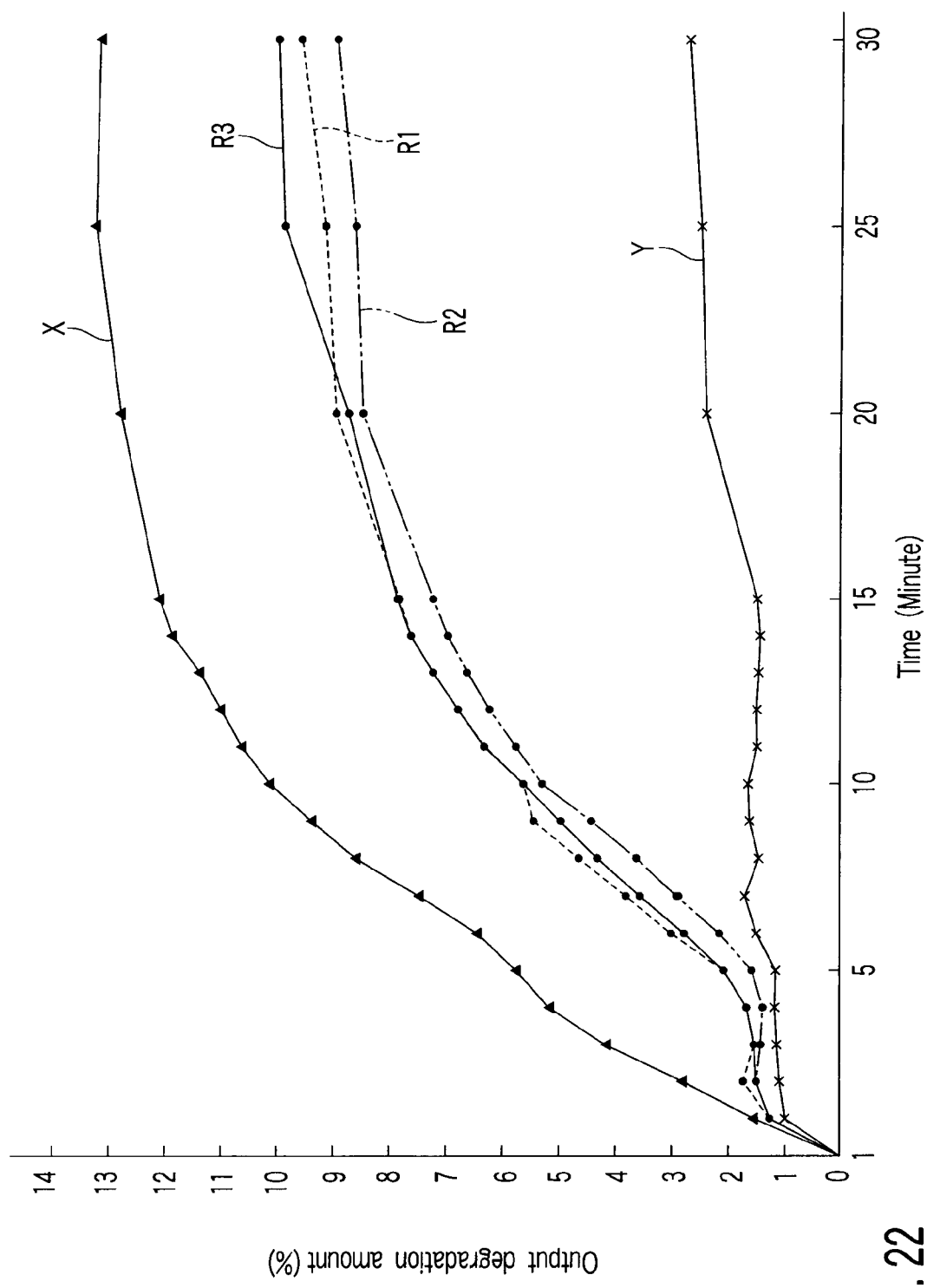
FIG. 22 is a characteristic graph showing a measurement result of degradation of outputs of the contact-type image sensors according to the first to third comparative examples, the measurement result being obtained for 30 minutes from the beginning of operation.

FIG. 22 shows a measurement result of the degradation of outputs of the contact-type image sensors 201, 301 and 401 according to the first to third comparative examples, the measurement result being obtained for 30 minutes from the beginning of operation. As regards the result of measurement, the difference between a maximum value and a minimum value of the initial output at the time of the beginning of the operation of the contact-type image sensor is set as an initial output value, and the output after the passing of a predetermined time from the beginning of the operation is indicated as a ratio to the initial output value that is a reference value.

In FIG. 22, a characteristic X indicates an output of the contact-type image sensor having no thermal diffusion layer. A characteristic R1 indicates an output of the contact-type image sensor 201 according to the first comparative example (FIG. 19). A characteristic R2 indicates an output of the contact-type image sensor 301 according to the second comparative example (FIG. 20). A characteristic R3 indicates an output of the contact-type image sensor 401 according to the third comparative example (FIG. 21). A characteristic Y indicates an output of the conventional contact-type image sensor which employs the LED as the light source.

According to this result of measurement, in the contact-type image sensors 201, 301 and 401 of the first to third comparative examples, the degradation amounts of outputs after the passing of 30 minutes from the beginning of operation are in the range of between 8% and 10%. It is understood that the degradation amounts of outputs are large, compared to the first to sixth embodiments of the present invention.

It follows from this that with the thermal diffusion layers 200, 300 and 400 having no metal plates, the heat that is conducted from the housing 11 to the EL light-emitting elements cannot fully be diffused. As a result, non-uniformity occurs in the temperature distribution of the EL light-emitting element, and the degradation amount of the output of the contact-type image sensor increases. It is thus concluded that a metal plate with good heat conductivity, such as a copper plate or an aluminum plate, should preferably be used as the thermal diffusion layer 48, 70, 80, 90, 100, 110 of the contact-type image sensor 10.

According to the image sensor of the present invention, when the housing receives heat, the heat is widely diffused via the thermal diffusion layer over the entire length of the EL light-emitting element, and then the heat is conducted to the EL light-emitting element. Thus, even if the EL light-emitting element is affected by thermal influence from the housing, the temperature distribution of the EL light-emitting element can be made uniform. Therefore, non-uniformity of luminance in the longitudinal direction of the EL light-emitting element can be eliminated.

Moreover, according to the image forming apparatus using the above-described image sensor, when light is radiated on the to-be-scanned object from the EL light-emitting element, the difference in illuminance on the to-be-scanned object can be decreased. Therefore, the degradation in image quality can be prevented, and the reliability in optical scanning of image information from the to-be-scanned object can be enhanced.

Seventh Embodiment

Figure 23:
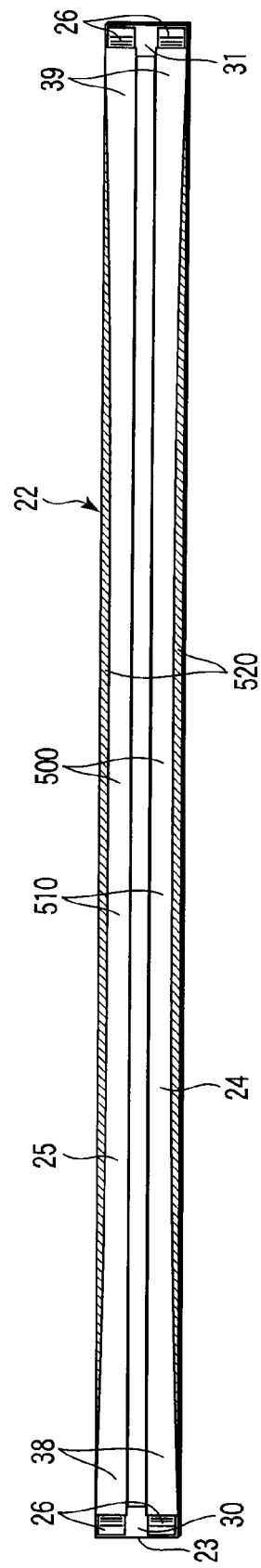
FIG. 23 is a plan view of an organic EL light source unit according to a seventh embodiment of the present invention.

FIG. 23 shows an organic EL light source unit 22 according to a seventh embodiment of the invention.

As has been described above, when information is optically scanned from the document 2, it is desirable to uniformize the distribution of illuminance on the illuminated surface of the document 2 in the longitudinal direction of the EL light-emitting elements 24 and 25 so as not to cause a difference in illuminance on the illuminated surface of the document 2.

Of the illuminated surface of the document 2, a central part thereof in the scanning direction is opposed to intermediate parts 500 of the EL light-emitting elements 24 and 25 and can receive light from a wide range in the longitudinal direction of the EL light-emitting elements 24 and 25. On the other hand, end portions of the illuminated surface, which are opposed to the first and second end portions 38 and 39 of the EL light-emitting elements 24 and 25, cannot receive light from the wide range in the longitudinal direction of the EL light-emitting elements 24 and 25. As a result, the illuminance is lower at the end portions of the illumination surface of the document 2 than at the central part of the illuminated surface.

Moreover, the temperature of the intermediate parts 500 of the EL light-emitting elements 24 and 25 increases due to the thermal influence of the LSI 57. Hence, the light intensity of the intermediate parts 500 of the EL light-emitting elements 24 and 25 becomes higher than the light intensity of the first and second end portions 38 and 39. As a result, the illuminance on the central part of the illuminated surface of the document 2, which is opposed to the intermediate parts 500 of the EL light-emitting elements 24 and 25, increases more and more, and the distribution of illuminance on the illuminated surface becomes non-uniform in the longitudinal direction (scanning direction) of the EL light-emitting elements 24 and 25.

Figure 24:
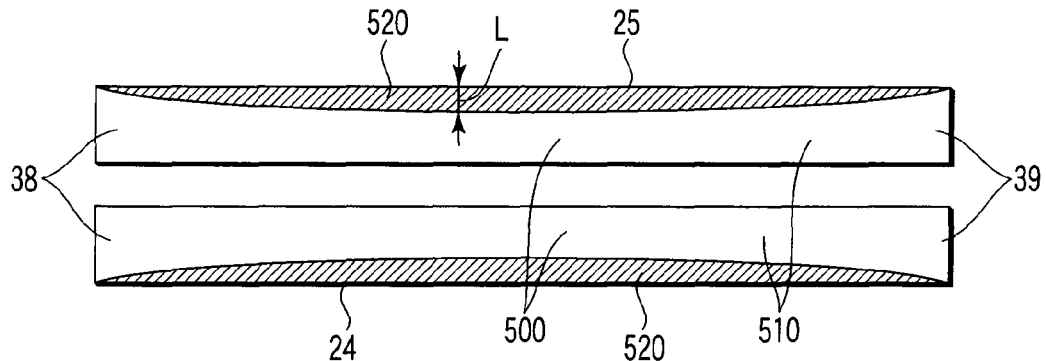
FIG. 24 is a plan view that schematically shows the state in which light emission surfaces of the EL light-emitting elements are covered with light-shield layers in the seventh embodiment of the invention.

In order to improve the non-uniformity in the distribution of illuminance, in the seventh embodiment, light-shield layers 520, as shown in FIG. 23 and FIG. 24, are formed on the upper surfaces of the glass base plates (numeral 36 in FIG. 4) that are disposed on light emission surfaces 510 of the EL light-emitting elements 24 and 25. For example, a black resin is used for the light-shield layer 520. The black resin has a thickness of, e.g. 0.2 mm, and has such characteristics as to be able to completely block transmission of light. The black resin is attached to the upper surface of the glass base plate.

The light-shield layer 520 has a width dimension L in a direction perpendicular to the longitudinal direction of the EL light-emitting element 24 or 25. The width dimension L of the light-shield layer 520 gradually decreases from the intermediate part 500 of the EL light-emitting element 24 or 25 toward the first and second end portions 38 and 39. In other words, the width dimension L of the light-shield layer 520 gradually decreases away from the intermediate part 500 of the EL light-emitting element 24 or 25 in the longitudinal direction of the EL light-emitting element 24 or 25.

As a result, at the position corresponding to the intermediate part 500 of the EL light-emitting element 24 or 25, the light emission surface 510 is largely covered with the light-shield layer 520, and the area which contributes to light emission decreases. Conversely, at the positions corresponding to the first and second end portions 38 and 39 of the EL light-emitting element 24 or 25, most of the light emission surface 510 is exposed and the area which contributes to light emission becomes larger than at the intermediate part 500.

Figure 25:
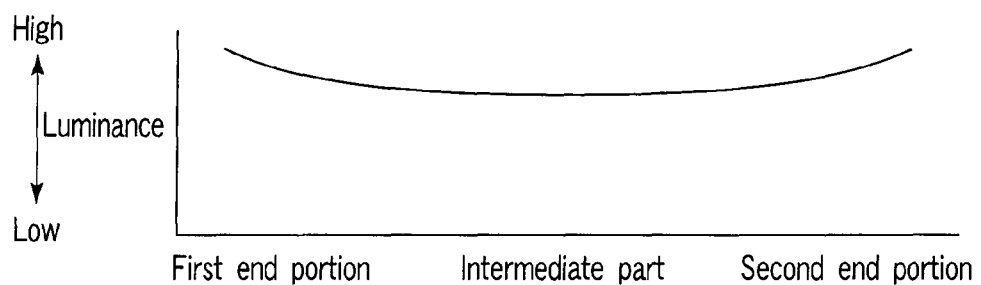
FIG. 25 is a characteristic graph showing a light intensity distribution in a longitudinal direction of the EL light-emitting element in the seventh embodiment of the invention.

FIG. 25 shows a light intensity distribution along the longitudinal direction of the EL light-emitting elements 24 and 25 having the light-shield layers 520. As is clear from FIG. 25, the light intensity is lower at the intermediate parts 500 of the EL light-emitting elements 24 and 25, than at the first and second end portions 38 and 39.

Thus, the light-shield layers 520 varies the light intensity distribution along the longitudinal direction of the EL light-emitting elements 24 and 25 so that the light intensity at the first and second end portions 38 and 39 of the EL light-emitting elements 24 and 25 may become higher than the light intensity at the intermediate parts 500.

According to the seventh embodiment of the present invention, the light intensity at the first and second end portions 38 and 39 of the EL light-emitting elements 24 and 25 becomes higher than the light intensity at the intermediate parts 500. Hence, when the light is radiated on the document 2 from the EL light-emitting elements 24 and 25, a difference in illuminance between the central portion and end portions of the illuminated surface of the document 2 decreases.

In other words, at the end portions of the document 2, compared to the central portion of the document 2, the light radiated from the EL light-emitting elements 24 and 25 decreases. However, by varying the light intensity distribution of the EL light-emitting elements 24 and 25 as described above, the amount of light radiated on the end portions of the document 2 and the amount of light radiated on the central portion of the document 2 are balanced. Thereby, a difference in illuminance between the end portion and the central portion of the document 2 is decreased.

Furthermore, even if the light intensity at the intermediate parts 500 of the EL light-emitting elements 24 and 25 increases due to the thermal influence of the LSI 57, the increase in light intensity is canceled by the presence of the light-shield layers 520. As a result, when light is radiated on the document 2 from the EL light-emitting elements 24 and 25, it becomes possible to prevent the illuminance on the illuminated surface of the document 2 from sharply decreasing at positions facing the first and second end portions 38 and 39 of the EL light-emitting elements 24 and 25.

Figure 26:
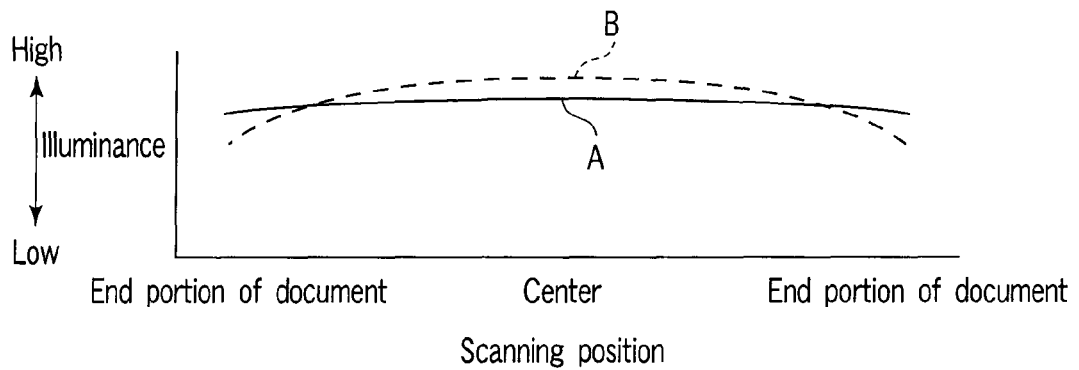
FIG. 26 is a characteristic graph showing an illuminance distribution on an illuminated surface of a document in the seventh embodiment of the invention.

FIG. 26 shows an illuminance distribution on the illuminated surface of the document 2 in the longitudinal direction (scanning direction) of the EL light-emitting elements 24 and 25. In FIG. 26, a characteristic A indicates an illuminance distribution on the illuminated surface when light is radiated on the document 2 by using the EL light-emitting elements 24 and 25 including the light-shield layers 520. A characteristic B indicates an illuminance distribution on the illuminated surface when light is radiated on the document 2 by using the EL light-emitting elements having a uniform light intensity distribution over the entire length.

In the case where the EL light-emitting elements having the uniform light intensity distribution are used, the illuminance on the illuminated surface of the document 2 is highest at the central part of the document 2, as indicated by the characteristic B, and gradually decreases toward the end portions of the document 2. Further, the illuminance on the illuminated surface tends to sharply decrease near the end portions of the document 2. The reason for this is that the amount of light of the EL light-emitting elements, which is guided to the end portions of the document 2, is smaller than the amount of light that is guided to the central portion of the document 2, and the light intensity at the intermediate parts of the EL light-emitting elements increases due to the temperature rise at the intermediate parts of the EL light-emitting elements.

By contrast, in the case of using the EL light-emitting elements 24 and 25 in which the light intensity distribution is varied by the light-shield layers 520, the amount of decrease of the illuminance at the end portions of the document 2 becomes smaller, as indicated by the characteristic A, although the illuminance on the central portion of the document 2 slightly decreases. The illuminance distribution from the end portions to the central portion of the document 2 is substantially uniform. This is because the amount of light radiated on the end portions of the document 2 and the amount of light radiated on the central portion of the document 2 are balanced by the presence of the light-shield layers 520.

According to the seventh embodiment, the light intensity at the first and second end portions of the EL light-emitting elements is higher than the light intensity at the intermediate parts of the EL light-emitting elements. Thus, when light is radiated on the to-be-scanned object from the EL light-emitting element, a difference in illuminance on the illuminated surface of the to-be-scanned object can be decreased. Therefore, degradation in image quality can be prevented without using a complex signal processing circuit, and the image information can stably be scanned from the to-be-scanned object.

Figure 27:
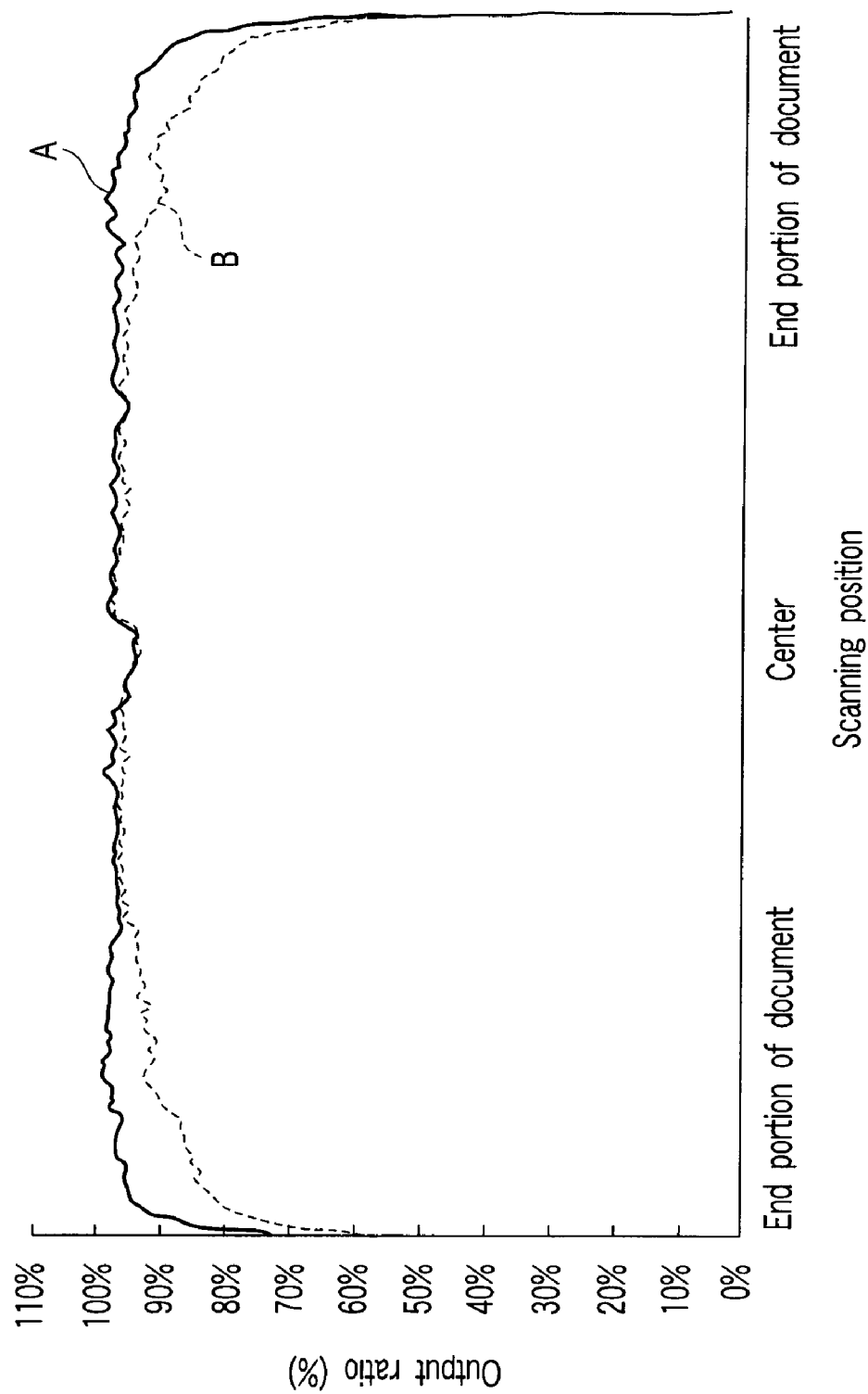
FIG. 27 is a characteristic graph showing an output ratio of the contact-type image sensor in the seventh embodiment of the invention.

FIG. 27 shows a comparison result between an output of the contact-type image sensor which employs the EL light-emitting elements 24 and 25 including the light-shield layers 520, and an output of the contact-type image sensor which employs the EL light-emitting elements having a uniform light intensity distribution over the entire length.

In FIG. 27, a characteristic A indicates the output of the contact-type image sensor which employs the EL light-emitting elements 24 and 25 including the light-shield layers 520. A characteristic B indicates, as a comparative example, the output of the contact-type image sensor which employs the EL light-emitting elements having a uniform light intensity distribution.

As is understood from FIG. 27, in the contact-type image sensor according to the seventh embodiment, the amount of decrease of the output at the end portions of the document 2 is small. By contrast, in the contact-type image sensor according to the comparative example, the amount of decrease of the output becomes greater toward the end portions of the document 2, than in the contact-type image sensor according to the seventh embodiment. It is thus understood that in the contact-type image sensor according to the comparative example, degradation occurs in the output at the parts corresponding to the end portions of the document 2, where the illuminance is low.

It follows from the above that according to the seventh embodiment of the present invention, the difference in illuminance on the illuminated surface of the document 2 can be decreased by intentionally varying the light intensity distribution along the longitudinal direction of the EL light-emitting elements 24 and 25. Therefore, the degradation in quality of an image that is scanned by the contact-type image sensor can be prevented by the simple structure, compared to the case where an image signal is corrected by using light-receiving sensors and complex signal processing circuits.

Eighth Embodiment

Figure 28:
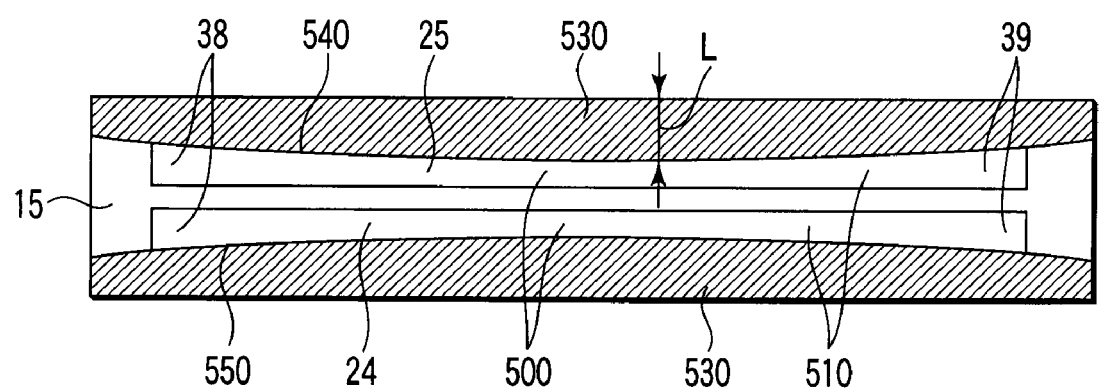
FIG. 28 is a plan view that schematically shows a state in which a glass plate of an organic EL light source unit is covered with light-shield layers in an eighth embodiment of the invention.

FIG. 28 schematically shows a contact-type image sensor according to an eighth embodiment of the present invention.

The eighth embodiment differs from the seventh embodiment in that light-shield layers 530 are formed on the glass plate 15 of the contact-type image sensor. In the other respects, the basic structure of the contact-type image sensor of the eighth embodiment is the same as that of the contact-type image sensor of the seventh embodiment. Thus, the structural parts common to those in the seventh embodiment are denoted by like reference numerals, and a description thereof is omitted.

As shown in FIG. 28, the glass plate 15 has a pair of regions 540 and 550 which cover the EL light-emitting elements 24 and 25 from above. The regions 540 and 550 extend in the longitudinal direction (scanning direction) of the EL light-emitting elements 24 and 25. The light-shield layers 530 are formed on the regions 540 and 550, respectively. The light-shield layer 530 has the same material and properties as the light-shield layer 520 in the seventh embodiment.

The light-shield layer 530 has a width dimension L in a direction perpendicular to the longitudinal direction of the EL light-emitting element 24 or 25. The width dimension L of the light-shield layer 530 gradually decreases from the intermediate part 500 of the EL light-emitting element 24 or 25 toward the first and second end portions 38 and 39. As a result, at the position corresponding to the intermediate part 500 of the EL light-emitting element 24 or 25, the light emission surface 510 is largely covered with the light-shield layer 530, and the area which contributes to light emission decreases. Conversely, at the positions corresponding to the first and second end portions 38 and 39 of the EL light-emitting element 24 or 25, most of the light emission surface 510 is exposed and the area which contributes to light emission becomes larger than at the intermediate part 500.

In the eighth embodiment, too, the light intensity at the first and second end portions 38 and 39 of the EL light-emitting elements 24 and 25 can be made higher than the light intensity at the intermediate parts 500 by the presence of the light-shield layers 530. Thus, when light is radiated on the document from the EL light-emitting elements 24 and 25, a difference in illuminance between the central portion and end portions of the illuminated surface of the document can be decreased. Therefore, like the seventh embodiment, degradation in quality of an image, which is scanned by the contact-type image sensor, can be prevented by the simple structure in which the light-shield layers 530 are merely provided on the glass plate 15.

The present invention is not limited to the above-described embodiments, and various modifications can be made without departing from the spirit of the invention.

The image sensor according to the invention is applicable not only to contact-type image sensors, but also to reduction focusing type image sensors. In the reduction focusing type image sensor, the EL light-emitting element is usable as a light source of the light emission section.

In the present invention, the exothermic body, which conducts heat to the housing, is not limited to the circuit board. For example, in the case where a motor which drives rollers is positioned near the housing of the image forming apparatus when the image sensor is accommodated in the housing of the image forming apparatus, this motor is an exothermic body which conducts heat to the housing.

The light-shield layer is not limited to a layer that completely blocks light, and may have such characteristics as to pass light to a certain degree. In addition, light-shield layers may be formed on both the light emission surface of the EL light-emitting element and the glass plate. Besides, since the light intensity can be expressed by a luminance and a light emission area, the light intensity may be varied by varying the luminance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An image sensor comprising:
a housing which receives heat of an exothermic body; and
an EL light-emitting element which emits light by organic electroluminescence, the EL light-emitting element being supported by the housing along a scanning direction and radiating light toward a to-be-scanned object; and
a thermal diffusion layer interposed between the EL light-emitting element and the housing, the thermal diffusion layer being provided over the entire length of the EL light-emitting element and diffusing heat conducting from the exothermic body to the EL light-emitting element via the housing.

2. The image sensor according to claim 1, wherein the EL light-emitting element is supported on a printed wiring board which extends in a line shape along the scanning direction, the thermal diffusion layer being thermally connected to a surface of the printed wiring board, which is located on a side opposite to the EL light-emitting element.

3. The image sensor according to claim 1, wherein the EL light-emitting element is supported on a printed wiring board which extends in a line shape along the scanning direction, the thermal diffusion layer being thermally connected to a surface of the printed wiring board, which faces the EL light-emitting element.

4. The image sensor according to claim 1, wherein the thermal diffusion layer has a higher heat conductivity than the housing.

5. An image sensor comprising:
an EL light-emitting element including a light emission section which emits light by electroluminescence, the EL light-emitting element radiating light from the light emission section toward a to-be-scanned object and extending in a line shape along a scanning direction;

a housing which supports the EL light-emitting element;

a circuit board which is supported in the housing and produces heat in operation; and a thermal diffusion layer which is interposed between the EL light-emitting element and the housing, the thermal diffusion layer diffusing heat conducting to the EL light-emitting element from the circuit board via the housing over the entire length of the EL light-emitting element.

6. The image sensor according to claim 5, wherein the housing is thermally connected to the circuit board, and the EL light-emitting element is electrically connected to the circuit board via a cable.

7. The image sensor according to claim 5, wherein the thermal diffusion layer has a higher heat conductivity than the housing.

8. The image sensor according to claim 5, wherein the thermal diffusion layer includes a metal plate and a thermal diffusion sheet which is stacked on the metal plate, the thermal diffusion sheet being interposed between the metal plate and the housing.

9. An image sensor comprising:

an EL light-emitting element including a light emission section which emits light by electroluminescence, the EL light-emitting element radiating light from the light emission section toward a to-be-scanned object and extending in a line shape along a scanning direction;

a housing which supports the EL light-emitting element; and a circuit board which is supported in the housing and on which a circuit component, which produces heat, is mounted at a position corresponding to an intermediate part in a longitudinal direction of the EL light-emitting element, wherein the light emission section of the EL light-emitting element has a light emission surface extending in the scanning direction, the light emission surface having a first end portion, a second end portion which is located on a side opposite to the first end portion, and an intermediate part which is located between the first end portion and the second end portion, a light-shield layer being formed on the light emission surface, the light-shield layer varying a light intensity distribution of the light emission surface such that a light intensity at the first and second end portions becomes higher than a light intensity at the intermediate part.

10. The image sensor according to claim 9, wherein the light-shield layer has a width dimension in a direction perpendicular to the scanning direction, and the width dimension of the light-shield layer gradually decreases from the intermediate part of the EL light-emitting element toward the first and second end portions.

11. An image sensor comprising:

an EL light-emitting element including a light emission section which emits light by electroluminescence, the EL light-emitting element radiating light from the light emission section toward a to-be-scanned object and extending in a line shape along a scanning direction;

a housing which supports the EL light-emitting element;

a circuit board which is supported in the housing and on which a circuit component, which produces heat, is mounted at a position corresponding to an intermediate part in a longitudinal direction of the EL light-emitting element;

a transparent plate which is interposed between the EL light-emitting element and the to-be-scanned object; and a light-shield layer which is provided on the transparent plate and varies a light intensity distribution of the EL light-emitting element.

12. The image sensor according to claim 11, wherein the transparent plate is supported on the housing in such a manner as to cover the EL light-emitting element.

13. The image sensor according to claim 11, wherein the light-shield layer has a width dimension in a direction perpendicular to the scanning direction, and the width dimension of the light-shield layer gradually decreases away from the intermediate part of the EL light-emitting element in the longitudinal direction of the EL light-emitting element.

14. An image forming apparatus including a transfer path which transfers a to-be-scanned object; and an image sensor which is disposed on the transfer path and optically scans image information from the to-be-scanned object, the image sensor comprising:

an EL light-emitting element including a light emission section which emits light by electroluminescence, the EL light-emitting element radiating light from the light emission section toward the to-be-scanned object and extending in a line shape along a scanning direction;

a housing which supports the EL light-emitting element;

a circuit board which is supported in the housing and produces heat in operation; and a thermal diffusion layer which is interposed between the EL light-emitting element and the housing, the thermal diffusion layer diffusing heat conducting to the EL light-emitting element from the circuit board via the housing over the entire length of the EL light-emitting element.

* * * * *